US010418345B2

(12) United States Patent
Suzuki et al.

(10) Patent No.: US 10,418,345 B2
(45) Date of Patent: Sep. 17, 2019

(54) SEMICONDUCTOR MEMORY DEVICE

(71) Applicant: TOSHIBA MEMORY CORPORATION, Tokyo (JP)

(72) Inventors: Toshihiro Suzuki, Ota Tokyo (JP); Yuji Nagai, Sagamihara Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/908,829

(22) Filed: Mar. 1, 2018

(65) Prior Publication Data

US 2019/0088622 A1 Mar. 21, 2019

(30) Foreign Application Priority Data

Sep. 21, 2017 (JP) ................. 2017-181318

(51) Int. Cl.
*G06F 13/00* (2006.01)
*H01L 25/065* (2006.01)
*H01L 25/10* (2006.01)
*G06F 13/16* (2006.01)
(Continued)

(52) U.S. Cl.
CPC ...... *H01L 25/0657* (2013.01); *G06F 13/1668* (2013.01); *H01L 25/105* (2013.01); *G11C 16/0483* (2013.01); *H01L 2225/0651* (2013.01); *H01L 2225/1064* (2013.01); *H03K 19/20* (2013.01)

(58) Field of Classification Search
None
See application file for complete search history.

(56) References Cited

U.S. PATENT DOCUMENTS

| 5,433,422 A | 7/1995 | Ross et al. |
| 7,276,786 B2 | 10/2007 | Cho et al. |
| 8,441,111 B2 | 5/2013 | Crisp et al. |

(Continued)

FOREIGN PATENT DOCUMENTS

| JP | 2000-340737 A | 12/2000 |
| JP | 4938273 B2 | 5/2012 |

(Continued)

OTHER PUBLICATIONS

Taiwanese Office Action dated Dec. 18, 2018 in related Taiwanese Patent Application 106146442, 4 pages.

*Primary Examiner* — Henry Tsai
*Assistant Examiner* — Dean Phan
(74) *Attorney, Agent, or Firm* — Kim & Stewart LLP

(57) ABSTRACT

A semiconductor memory device includes a substrate that has a first main surface and a second main surface opposite to the first main surface, a first semiconductor chip which is mounted on the first main surface and includes a first register, a plurality of first input/output (IO) terminals, and a first circuit connected between the first IO terminals and the first register, and a second semiconductor chip which is mounted on the second main surface and includes a second register, a plurality of second input/output (IO) terminals, and a second circuit connected between the second IO terminals and the second register. The second circuit is connected to the second IO terminals through input lines and to the second register through output lines, and is configured to change a connection path between the input lines and the output lines in response to a connection change command.

14 Claims, 25 Drawing Sheets

(51) Int. Cl.
*G11C 16/04* (2006.01)
*H03K 19/20* (2006.01)

(56) References Cited

U.S. PATENT DOCUMENTS

| | | | | |
|---|---|---|---|---|
| 2011/0085404 A1* | 4/2011 | Yoko | ........................ | G11C 5/02 365/230.03 |
| 2014/0104935 A1* | 4/2014 | Ware | ................... | G06F 13/4068 365/154 |

FOREIGN PATENT DOCUMENTS

| | | | |
|---|---|---|---|
| TW | 200727308 | A | 7/2007 |
| TW | 201023189 | A | 6/2010 |
| TW | 201535592 | A | 9/2015 |
| TW | I628447 | B | 7/2018 |

\* cited by examiner

FIG. 9A
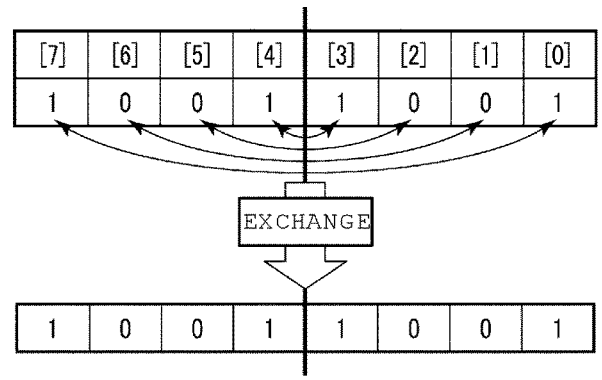
FIG. 9B
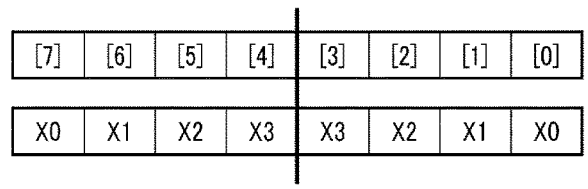
FIG. 9C
| # | [7] | [6] | [5] | [4] | [3] | [2] | [1] | [0] | hex |
|---|---|---|---|---|---|---|---|---|---|
| 1 | 0 | 0 | 0 | 0 | 0 | 0 | 0 | 0 | 00 |
| 2 | 0 | 0 | 0 | 1 | 1 | 0 | 0 | 0 | 18 |
| 3 | 0 | 0 | 1 | 0 | 0 | 1 | 0 | 0 | 24 |
| 4 | 0 | 0 | 1 | 1 | 1 | 1 | 0 | 0 | 3C |
| 5 | 0 | 1 | 0 | 0 | 0 | 0 | 1 | 0 | 42 |
| 6 | 0 | 1 | 0 | 1 | 1 | 0 | 1 | 0 | 5A |
| 7 | 0 | 1 | 1 | 0 | 0 | 1 | 1 | 0 | 66 |
| 8 | 0 | 1 | 1 | 1 | 1 | 1 | 1 | 0 | 7E |
| 9 | 1 | 0 | 0 | 0 | 0 | 0 | 0 | 1 | 81 |
| 10 | 1 | 0 | 0 | 1 | 1 | 0 | 0 | 1 | 99 |
| 11 | 1 | 0 | 1 | 0 | 0 | 1 | 0 | 1 | A5 |
| 12 | 1 | 0 | 1 | 1 | 1 | 1 | 0 | 1 | BD |
| 13 | 1 | 1 | 0 | 0 | 0 | 0 | 1 | 1 | C3 |
| 14 | 1 | 1 | 0 | 1 | 1 | 0 | 1 | 1 | DB |
| 15 | 1 | 1 | 1 | 0 | 0 | 1 | 1 | 1 | E7 |
| 16 | 1 | 1 | 1 | 1 | 1 | 1 | 1 | 1 | FF |

FIG. 14A

| [7] | [6] | [5] | [4] | [3] | [2] | [1] | [0] |
|---|---|---|---|---|---|---|---|
| X0 | X1 | X1 | X0 | X0 | X1 | X1 | X0 |

FIG. 14B

| # | [7] | [6] | [5] | [4] | [3] | [2] | [1] | [0] | hex |
|---|---|---|---|---|---|---|---|---|---|
| 1 | 0 | 0 | 0 | 0 | 0 | 0 | 0 | 0 | 00 |
| 2 | 0 | 1 | 1 | 0 | 0 | 1 | 1 | 0 | 66 |
| 3 | 1 | 0 | 0 | 1 | 1 | 0 | 0 | 1 | 99 |
| 4 | 1 | 1 | 1 | 1 | 1 | 1 | 1 | 1 | FF |

| ADD | 00h | FFh | 66h | 99h |
|---|---|---|---|---|
| PATTERN 1 | PATTERN 2 | PATTERN 3 | PATTERN 4 | PATTERN 5 |

SEMICONDUCTOR MEMORY DEVICE

CROSS-REFERENCE TO RELATED APPLICATION

This application is based upon and claims the benefit of priority from Japanese Patent Application No. 2017-181318, filed Sep. 21, 2017, the entire contents of which are incorporated herein by reference.

FIELD

Embodiments described herein relate generally to a semiconductor memory device.

BACKGROUND

A double-side mounted semiconductor memory device is known in which packages, each including a semiconductor chip (for example, a chip of a NAND flash memory), are mounted on both surfaces of a substrate. In the double-side mounted semiconductor memory device, one package is mounted on a first main surface of the substrate, and the other package is mounted on a second main surface opposite to the first main surface.

DESCRIPTION OF THE DRAWINGS

FIGS. 9A to 9C are diagrams illustrating details of a connection change command used in the first embodiment.

FIGS. 14A and 14B are diagrams illustrating details of a connection change command used in a second embodiment.

DETAILED DESCRIPTION

Figure 1:
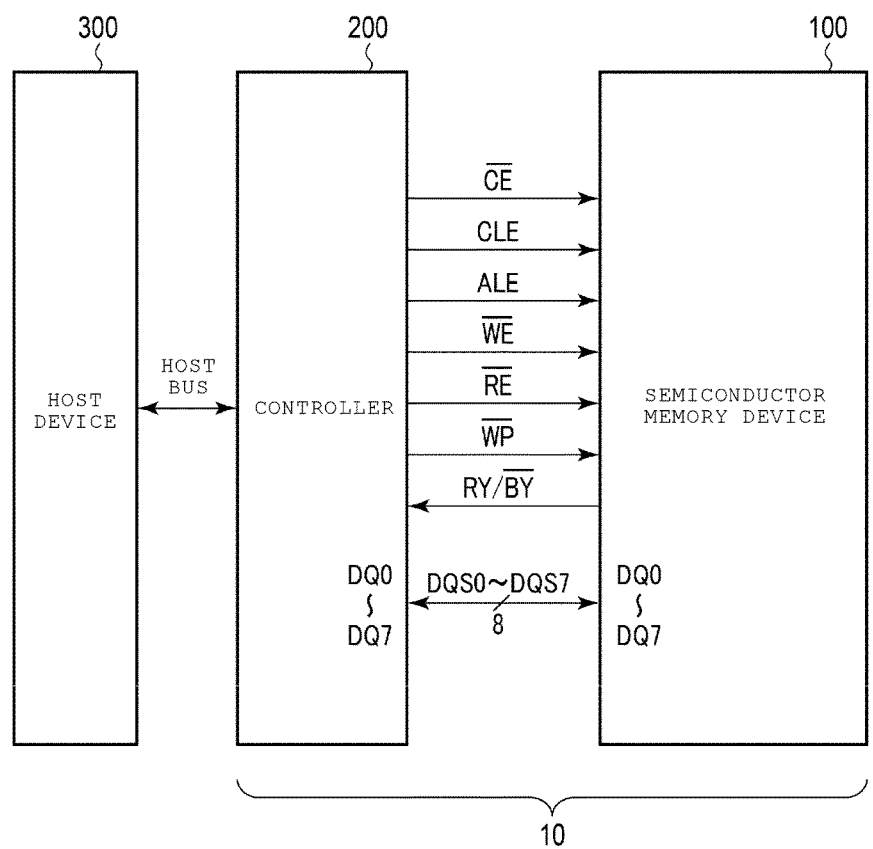
FIG. 1 is a diagram illustrating a configuration of a memory system including a semiconductor memory device according to a first embodiment.

Embodiments provide a semiconductor memory device which can increase data transfer speed.

In general, according to one embodiment, a semiconductor memory device includes a substrate that has a first main surface and a second main surface opposite to the first main surface, a first package including a first semiconductor chip which is mounted on the first main surface and includes a first register, a plurality of first input/output (IO) terminals, and a first circuit connected between the first IO terminals and the first register, and a second package including a second semiconductor chip which is mounted on the second main surface and includes a second register, a plurality of second input/output (IO) terminals, and a second circuit connected between the second IO terminals and the second register. The second circuit is connected to the second IO terminals through a plurality of input lines and to the second register through a plurality of output lines, and is configured to change a connection path between the input lines and the output lines in response to a connection change command generated in the second semiconductor chip.

Hereinafter, embodiments will be described with reference to the drawings. In the following description, elements having the same function and configuration are denoted by the same reference numerals or symbols. In addition, each of the embodiments described below provides a device and a method for embodying a technical idea disclosed herein, and the technical idea is not limited to a particular material, shape, structure, arrangement, and the like of the examples given herein.

Each functional block can be implemented in hardware or computer software, or a combination of both. Functional blocks are not limited to those given in the following examples. For example, one or several functions may be implemented in a functional block other than the particular functional block described herein. Furthermore, the functional block that is described herein may be divided into functional sub-blocks. Here, NAND flash memory will be described as an example of a semiconductor memory device.

[1] First Embodiment

First, a configuration of a memory system including a semiconductor memory device according to a first embodiment will be described.

[1-1] Configuration of Memory System

FIG. 1 is a block diagram illustrating a configuration of a memory system. The memory system 10 includes a semiconductor memory device 100 and a controller 200.

In the semiconductor memory device 100, a package including a semiconductor chip (for example, a chip of a NAND flash memory) is mounted on both surfaces of a substrate. Details of the semiconductor memory device 100 will be described below.

The controller 200 is connected to the semiconductor memory device 100 by a NAND bus. In addition, the controller 200 is connected to an external host device 300 through a host bus. The controller 200 controls the semiconductor memory device 100 and controls reading, writing, erasing, and the like of the semiconductor memory device 100 in response to a command received from the host device 300.

The NAND bus communicates signals according to a NAND interface. For example, a chip enable signal /CE, a command latch enable signal CLE, an address latch enable signal ALE, a write enable signal /WE, a read enable signal /RE, and a write protect signal /WP are used as the signals.

The chip enable signal /CE enables the semiconductor memory device 100. Each of the command latch enable signal CLE and the address latch enable signal ALE notifies the semiconductor memory device 100 that an input signal is a command or an address signal, respectively. Each of the write enable signal /WE and the read enable signal /RE instructs the semiconductor memory device 100 to input/output data through data pins or input/output terminals (hereinafter, referred to as DQ pins) DQ0, DQ1, . . . , DQ7 at the time of writing and reading, respectively. A write protection signal /WP makes the semiconductor memory device 100 to be in a write protection state, for example, when a power supply is turned on and off.

A ready/busy signal RY/(/BY) notifies the controller 200 whether the semiconductor memory device 100 is in a ready state (a state in which a command can be received from the controller 200) or a busy state (a state in which a command cannot be received from the controller 200). For example, the ready/busy signal RY/(/BY) goes to an "L" level (busy state) while the semiconductor memory device 100 performs an operation such as reading data, and goes to an "H" level (ready state) if the operation is completed.

Signals DQS0 to DQS7 input and output through the DQ pins DQ0 to DQ7 are, for example, eight bit signals. The signals DQS0 to DQS7 are data signals between the semiconductor memory device 100 and the controller 200, and may include a command, an address, write data, read data, status information of the semiconductor memory device 100, and the like.

The above-described memory system can be applied to the semiconductor memory devices according to all the following embodiments.

[1-2] Structure of Semiconductor Memory Device

Figure 2:
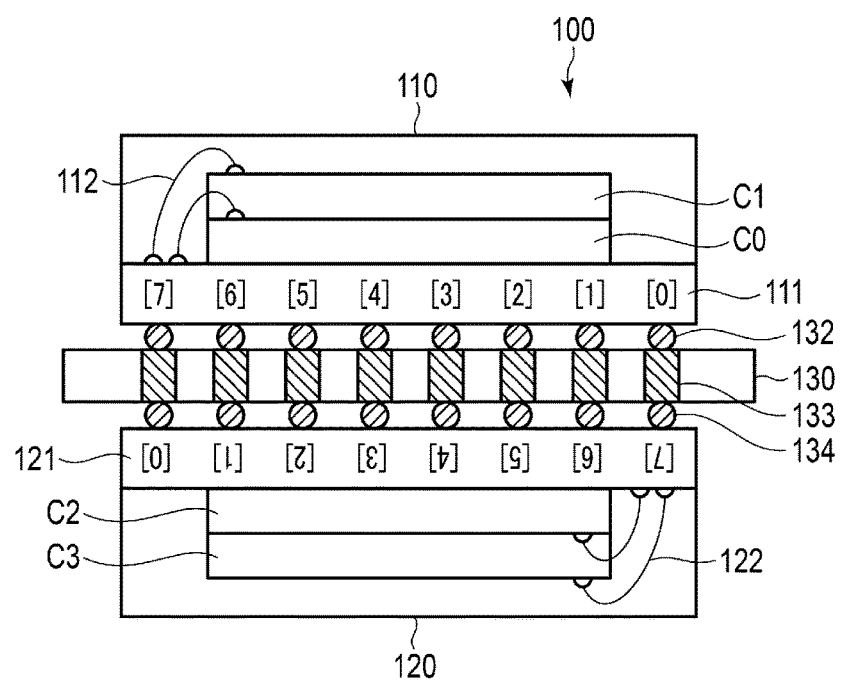
FIG. 2 is a sectional view illustrating an example of a structure of the semiconductor memory device.

Next, a structure of the semiconductor memory device 100 according to the first embodiment will be described with reference to FIG. 2. FIG. 2 is a sectional view illustrating an example of the structure of the semiconductor memory device. The semiconductor memory device 100 includes a normal package 110, a mirror package 120, and a substrate 130. The normal package 110 is mounted on a front surface of the substrate 130. The mirror package 120 is mounted on a rear surface of the substrate 130. In one embodiment, the substrate 130 extends further from its left or right edge than as shown in FIG. 2 so as be able to accommodate the controller 200 on a surface of the extended part. In addition, wirings are provided in and on the substrate 130 to connect the controller 200 to the semiconductor memory device 100 as further described below.

The normal package 110 includes one or a plurality of semiconductor chips (hereinafter, referred to as flash memory chips) of a NAND flash memory, for example, flash memory chips C0 and C1, and a grid array substrate 111. The flash memory chips C0 and C1 are sequentially stacked on the grid array substrate 111. The grid array substrate 111 has a plurality of DQ pins (DQ0, DQ1, . . . , DQ7). In the same manner, each of the flash memory chips C0 and C1 has a plurality of DQ pins (DQ0, DQ1, . . . , DQ7) (not illustrated). In the DQ pins of the grid array substrate 111 and the DQ pins of each of the flash memory chips C0 and C1, pins having the same numbers are electrically connected to each other by bonding wires 112 or the like. The grid array substrate 111 and the flash memory chips C0 and C1 are packaged with resin or the like. Furthermore, the DQ pins of the grid array substrate 111 are connected to the first main surface of the substrate 130 through, for example, solder balls 132. Hereinafter, the DQ pins of the grid array substrate 111 are referred to as DQ pins of the normal package 110.

The mirror package 120 is configured with the same package as the above-described normal package, and includes one or more flash memory chips, for example, flash memory chips C2 and C3, and a grid array substrate 121. Flash memories C2 and C3 are sequentially stacked on the grid array substrate 121. The grid array substrate 121 has a plurality of DQ pins (DQ0, DQ1, . . . , DQ7). Each of the flash memory chips C2 and C3 has a plurality of DQ pins (DQ0, DQ1, . . . , DQ7) (not illustrated) in the same manner as each other. In the DQ pins of the grid array substrate 121 and the DQ pins of each of the flash memory chips C2 and C3, pins having the same numbers are electrically connected to each other by bonding wires 122 or the like. The grid array substrate 121 and the flash memory chips C2 and C3 are packaged with resin or the like. Furthermore, the DQ pins of the grid array substrate 121 are connected to the second main surface of the substrate 130 through, for example, solder balls 134. Hereinafter, the DQ pins of the grid array substrate 121 will be referred to as the DQ pins of the mirror package 120.

For example, the DQ pins DQ0 to DQ7 of the normal package 110 are respectively connected to the DQ pins DQ7 to DQ0 of the mirror package 120 through the solder balls 132, vias 133, the solder balls 134, and the like. In detail, DQ0 of the normal package 110 is electrically connected to the DQ7 of the mirror package 120. In the same manner, DQ1 is electrically connected to DQ6, DQ2 to DQ5, DQ3 to DQ4, DQ4 to DQ3, DQ5 to DQ2, DQ6 to DQ1, and DQ7 to DQ0. In this way, by connecting the DQ pins disposed so as to face each other with the substrate 130 interposed therebetween, the wires or the like connecting the DQ pins are shortened, such that it is advantageous to transfer data.

The signals DQS0 to DQS7, are respectively input and output to and from the DQ pins DQ0 to DQ7 of the normal package 110 and the mirror package 120. The flash memory chips C0 to C3 include a plurality of memory cells that store data in a nonvolatile manner.

In addition, each of the flash memory chips C0 to C3 includes a chip enable pin, a command latch enable pin, an address latch enable pin, a write enable pin, a read enable pin, a write protection pin, and a ready/busy pin (not illustrated). The pins are respectively and electrically connected to the corresponding pins of the grid array substrates 111 and 121. The pins respectively receive the chip enable signal /CE, the command latch enable signal CLE, the address latch enable signal ALE, the write enable signal /WE, the read enable signal /RE, the write protection signal /WP, and the ready/busy signal RY/(/BY) which are illustrated in FIG. 1.

The normal package 110 represents a package in which the pins having the same numbers are connected to each other in the DQ pins of the package (and the DQ pins of the chips C0 and C1) and the DQ pins of the controller 200. That is, the normal package indicates a package in which DQ0 of the flash memory chips C0 and C1 is connected to DQ0 of the controller 200, and in the same manner, DQ1 is connected to DQ1, DQ2 is connected to DQ2, . . . , and DQ7 is connected to DQ7.

The mirror package 120 represents a package mounted so as to face the normal package 110 on a rear surface of the substrate 130 by rotating a package having the same configuration as the normal package 110 by 180°. The DQ pins (and the DQ pins of the chips C2 and C3) of the mirror package 120 are connected to the DQ pin of the normal package 110 (or the controller 200), based on a certain connection rule. The connection rule will be described in patterns 1 to 5 (FIGS. 3, 4, and 15 to 22) which will be described below.

Figure 3:
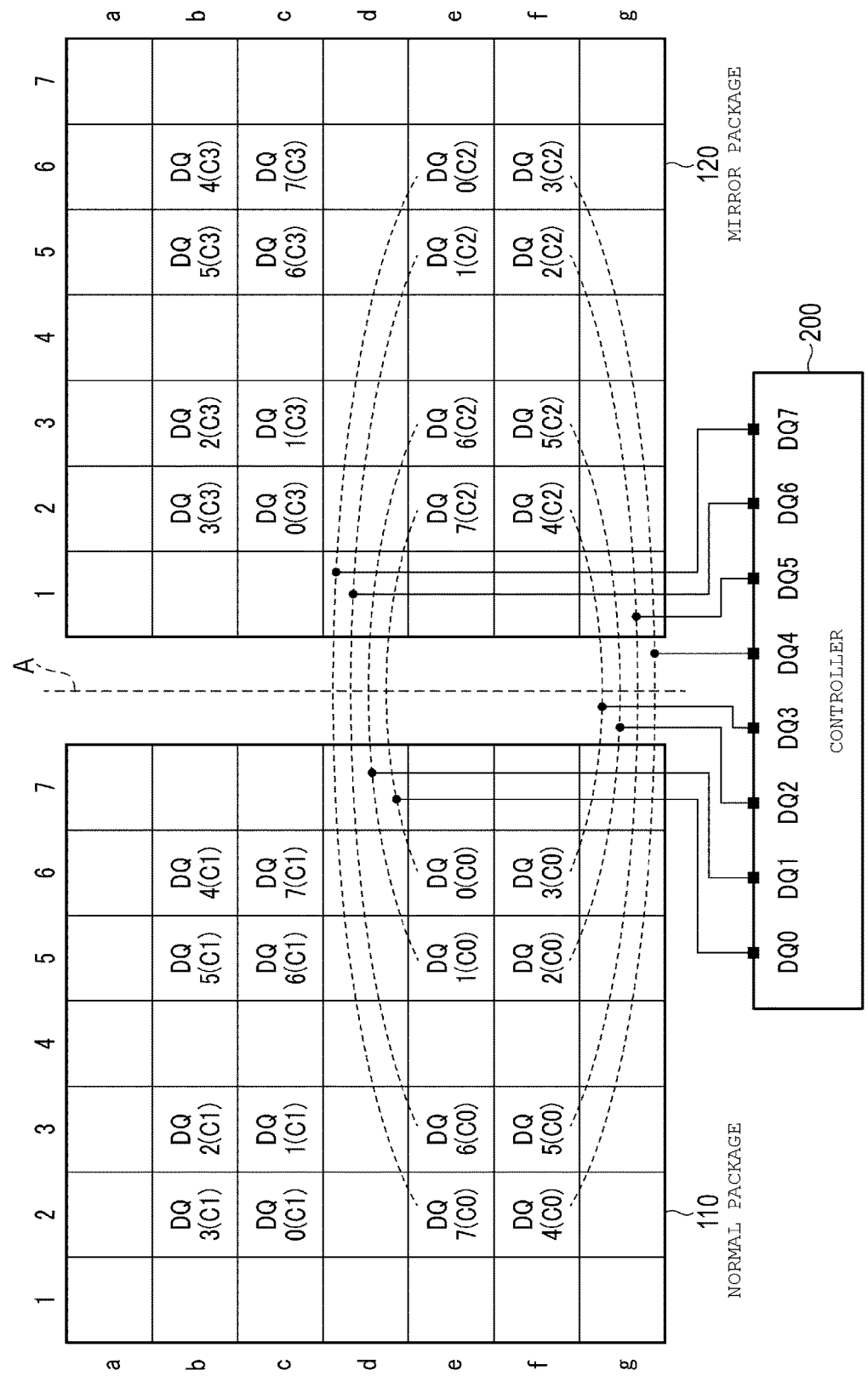
FIG. 3 is a plan diagram illustrating an array of DQ pins of a normal package and a mirror package provided in the semiconductor memory device.

Next, an array of the DQ pins in the semiconductor memory device 100 will be described with reference to FIG. 3. FIG. 3 is a plan view illustrating the array of the DQ pins of the normal package 110 and the mirror package 120. 1, 2, 3, . . . , 7 and a, b, c, g denoted in the normal package 110 and the mirror package 120 respectively represent X and Y coordinates when the normal package 110 and the mirror package 120 are viewed as planes. C0, C1, C2, and C3 in FIG. 3 correspond to the flash memory chips C0 and C1 in the normal package 110 and the flash memory chips C2 and C3 in the mirror package 120. In addition, the normal package 110 and the mirror package 120 are manufactured to have the same configuration. That is, the normal package 110 and the mirror package 120 have the same pin array, the same circuit, and the like. Notations of the X and Y coordinates, C0, C1, C2, and C3 and that the normal package 110 and the mirror package 120 have the same configuration are also the same in the following embodiments.

Mounting the normal package 110 on the first main surface of the substrate 130 and mounting the mirror package 120 on the second main surface correspond to folding a paper surface of FIG. 3 about a dashed line A between the packages in FIG. 3 and bringing the two packages together for bonding.

Dashed lines connecting, for example, DQ0 (C0) and DQ7 (C2), DQ1 (C0) and DQ6 (C2) , DQ2 (C0) and DQ5 (C2), . . . , DQ7 (C0) and DQ0 (C2) between the DQ pins of the normal package 110 and the DQ pins of the mirror package 120 in FIG. 3 indicates that the DQ pins are respectively connected to each other. Furthermore, solid lines connected to the dashed lines indicates that the DQ pins of the packages 110 and 120 and the DQ pins DQ0, DQ1, DQ2, . . . , DQ7 of the controller 200 are connected to each other.

For example, DQ0 (C0), DQ1 (C0), DQ2 (C0), and DQ3 (C0) are disposed in the pin coordinates 6-e, 5-e, 5-f, 6-f of the normal package 110. The pin coordinates 2-e, 3-e, 3-f, and 2-f of the mirror package 120 are connected to the DQ0 (C0) to DQ3 (C0), and respectively correspond to DQ7 (C2) , DQ6 (C2), DQ5 (C2), and DQ4 (C2) of the normal package 120.

Figure 4:
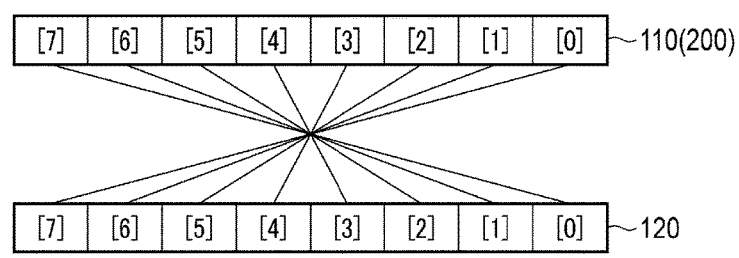
FIG. 4 is a diagram illustrating extracted numbers of DQ pins of a controller, the normal package, and the mirror package provided in the semiconductor memory device.

Next, the connection rule of the DQ pin illustrated in FIG. 3 will be described with reference to FIG. 4 for easier understanding. FIG. 4 is a diagram illustrating only extracted numbers of the DQ pins of the controller 200 and the normal package 110 and extracted numbers of the DQ pins of the mirror package 120.

In the DQ pins of the normal package 110 and the DQ pins of the chips C0 and C1 in the normal package 110, pins having the same numbers are connected to each other. In the same manner, in the DQ pins of the mirror package 120 and the DQ pins of the chips C2 and C3 in the mirror package 120, the pins having the same numbers are connected to each other. Furthermore, in the DQ pins of the controller 200 and the DQ pins of the normal package 110, pins having the same numbers are connected to each other. In FIG. 4, the DQ pins of the controller 200 and the DQ pins of the normal package 110 are indicated by [0] to [7] in one row, and in the same manner, the DQ pins of the mirror package 120 are indicated by [0] to [7] in one row. The connections and notations are also the same as in the following embodiments.

As described above, DQ0 and DQ7, DQ1 and DQ6, DQ2 and DQ5, DQ3 and DQ4, DQ4 and DQ3, DQ5 and DQ2, DQ6 and DQ1, and DQ7 and DQ0 are respectively connected to each other, between the DQ pins of the controller 200 and the normal package 110 and the DQ pins of the mirror package 120. Hereinafter, the connection rule of the DQ pins illustrated in FIG. 4 is referred to as pattern 1.

In a case where there is the connection rule of pattern 1, data output from the DQ pins of the controller 200 is converted according to the connection rule of pattern 1 and input to the DQ pin of the mirror package 120 as data different from data. For example, if data DQ[7:0]=00001111 (0Fh) is output from the controller 200, data DQ[7:0]=11110000 (F0h) is input to the DQ pins of the mirror package 120, and the data transmitted by the controller 200 differs from the data received by the DQ pins of the mirror package 120.

[1-3] Circuit Configuration of Semiconductor Memory Device

The semiconductor memory device 100 according to the first embodiment includes a connection change circuit in a flash memory chip in a package. The connection change circuit performs connection changes of the DQ pins of the chip C2, based on the connection rule between the DQ pins of the mirror package 120 and the DQ pins of the normal package 110.

Figure 5:
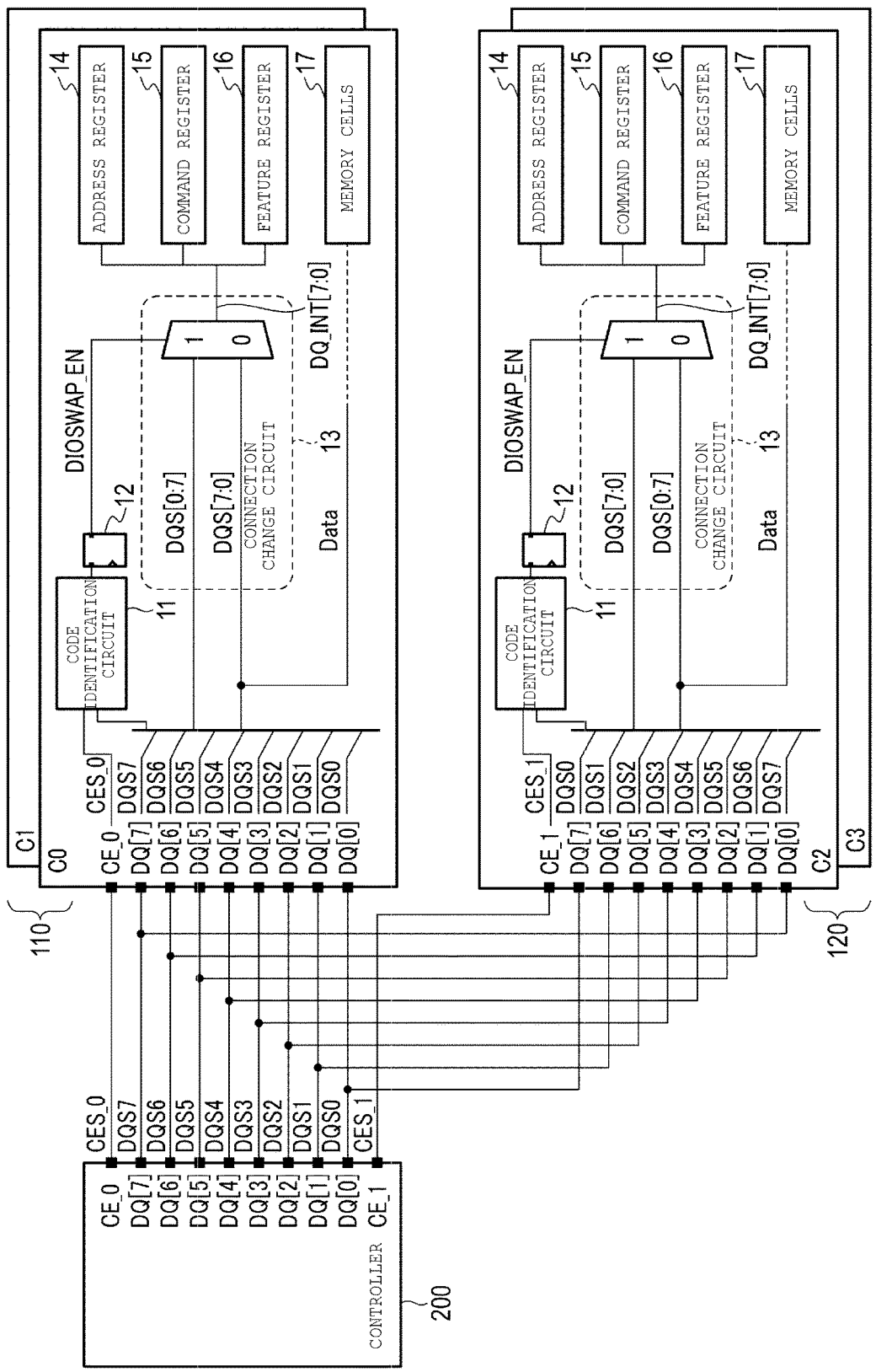
FIG. 5 is a diagram illustrating a circuit configuration used when data is input to the semiconductor memory device.

FIG. 5 is a diagram illustrating a circuit configuration used when data is input to the semiconductor memory device. As described above, the semiconductor memory device 100 includes the normal package 110 and the mirror package 120. The controller 200 is connected to the normal package 110 and the mirror package 120. The normal package 110 includes the flash memory chips C0 and C1, and the mirror package 120 includes the flash memory chips C2 and C3. The flash memory chips C0, C1, C2 and C3 have the same configuration. Here, the circuit configuration of the flash memory chip C0 in the normal package 110 and the flash memory chip C2 in the mirror package 120 will be described.

The flash memory chip C0 includes a chip enable pin CE_0, the DQ pins DQ0 to DQ7, a code identification circuit 11, a flip-flop 12, a connection change circuit 13, an address register 14, a command register 15, a feature register 16, and memory cells 17 of a NAND flash memory. The code identification circuit 11 outputs an identification signal, based on the signals DQS0 to DQS7 input to the DQ pins DQ0 to DQ7. The connection change circuit 13 includes, for example, a multiplexer. The flash memory chip C2 is the same as the flash memory chip C0 except that the flash memory chip C2 includes a chip enable pin CE_1 instead of the chip enable pin CE_0.

The controller 200 includes chip enable pins CE_0, CE_1, and DQ pins DQ0 through DQ7. The chip enable pin CE_0 of the controller 200 is connected to the chip enable pin CE_0 of the flash memory chip C0. The chip enable pin CE_1 of the controller 200 is connected to the chip enable pin CE_1 of the flash memory chip C2.

The DQ pins DQ0 to DQ7 of the controller 200 are respectively connected to the DQ pins DQ0 to DQ7 of the flash memory chip C0 of the normal package 110. Furthermore, the DQ pins DQ0 to DQ7 of the controller 200 are respectively connected to the DQ pins DQ7 to DQ0 of the flash memory chip C2 of the mirror package 120. Thereby, the DQ pins DQ0 to DQ7 of the chip C0 of the normal package 110 are respectively connected to the DQ pins DQ7 to DQ0 of the chip C2 of the mirror package 120.

The controller 200 outputs the following signals to the flash memory chip C0 of the normal package 110. The controller 200 outputs the chip enable signal CES_0 from the chip enable pin CE_0 to the chip enable pin CE_0 of the chip C0. Furthermore, the controller 200 outputs the signals DQS0, DQS1, DQS2, . . . , DQS7 from the DQ pins DQ0 to DQ7 to the DQ pins DQ0 to DQ7 of the chip C0. Hereinafter, in a case where the signals DQS0 to DQS7 are respectively input to the DQ pins DQ0 to DQ7, the signals are referred to as signals DQS[7:0].

The controller 200 outputs the following signals to the flash memory chip C2 in the mirror package 120. The controller 200 outputs the chip enable signal CES_1 from the chip enable pin CE_1 to the chip enable pin CE_1 of the chip C2. Furthermore, the controller 200 outputs the signals DQS0, DQS1, DQS2, . . . , DQS7 from the DQ pins DQ0 to DQ7 to the DQ pins DQ7 to DQ0 of the chip C2. Hereinafter, in a case where the signals DQS0 to DQS7 are respectively input to the DQ pins DQ7 to DQ0, the signals are referred to as signals DQS[0:7].

Next, a circuit connection and an operation of the flash memory chip C0 in the normal package 110 will be described.

The chip enable pin CE_0 of the chip C0 receives the chip enable signal CES_0 from the controller 200. The chip enable signal CES_0 is input to a first input terminal of the code identification circuit 11. The DQ pins DQ0 to DQ7 of the chip C0 receive the signals DQS[7:0] from the DQ pins DQ0 to DQ7 of the controller 200. The signals DQS[7:0] are input to a second input terminal of the code identification circuit 11. An input terminal of the flip-flop 12 receives an output of the code identification circuit 11. A clock terminal of the flip-flop 12 receives a clock signal. When receiving the clock signal at the clock terminal, the flip-flop 12 outputs an identification signal stored in the flip-flop 12 as a selection signal DIOSWAP_EN from an output terminal thereof to a control terminal of a multiplexer provided in the connection change circuit 13.

Here, if the flash memory chip C0 is enabled by the chip enable signal CES_0 and a connection change command is input by the signals DQS[7:0], the selection signal DIOSWAP_EN supplied from the code identification circuit 11 through the flip-flop 12 would instruct the connection change circuit 13 to change connections between the DQ pins. However, as will be described below, when the connection change command is actually input, the chip C0 in the normal package 110 is disabled, and thus, the selection signal DIOSWAP_EN does not instruct a connection change of the DQ pins.

A first input portion (channel 0) of the multiplexer of the connection change circuit 13 receives the signals DQS[7:0] and the second input portion (channel 1) receives the signals DQS[0:7]. The multiplexer selects the signals DQS[7:0] or the signals DQS [0:7], according to the selection signal DIOSWAP_EN received at the control terminal, and outputs the selected signals as signals DQ_INT[7:0]. In the flash memory chip C0, the signals DQS[7:0] are selected by the selection signal DIOSWAP_EN ("0") and are output as the signals DQ_INT[7:0].

In a case where the signals indicate an address, the signals DQ_INT[7:0] output from the connection change circuit 13 are input to the address register 14, and in a case where the signals indicate a command, the signals are input to the command register 15, and in a case where the signals indicate a feature code, the signals are input to the feature register 16. Specifically, when the address latch enable signal ALE is asserted, the signals DQ_INT[7:0] are stored in the address register 14. In addition, when the command latch enable signal CLE is asserted, the signals DQ_INT[7:0] are stored in the command register 15. In addition, when the command EFh is received, the signals DQ_INT[7:0] are stored in the feature register 16.

In a case where the signals DQS[7:0] input to the DQ pins DQ0 to DQ7 of the flash memory chip C0 are write data, the signals DQS[7:0] do not pass through the connection change circuit 13 but are stored in the memory cells 17.

Next, a circuit connection and an operation of the flash memory chip C2 in the mirror package 120 will be described.

The chip enable pin CE_1 of the chip C2 receives the chip enable signal CES_1 from the controller 200. The chip enable signal CES_1 is input to a first input terminal of the code identification circuit 11. The DQ pins DQ0 to DQ7 of the chip C2 receive the signals DQS[0:7] from the DQ pins DQ0 to DQ7 of the controller 200. The signals DQS[0:7] are input to a second input terminal of the code identification circuit 11. An input terminal of the flip-flop 12 receives an output of the code identification circuit 11. A clock terminal of the flip-flop 12 receives a clock signal. When receiving the clock signal at the clock terminal, the flip-flop 12 outputs an identification signal stored in the flip-flop 12 as a selection signal DIOSWAP_EN from an output terminal thereof to a control terminal of a multiplexer.

When the flash memory chip C2 is enabled by the chip enable signal CES_1 and a connection change command is input by the signals DQS[0:7], the selection signal DIOSWAP_EN instructs the connection change circuit 13 to change connections of the DQ pins.

A first input portion (channel 0) of the multiplexer of the connection change circuit 13 receives the signals DQS[0:7] and a second input portion (channel 1) receives the signals DQS[7:0]. The multiplexer selects the signals DQS[0:7] or the signals DQS[7:0], according to the selection signal DIOSWAP_EN received at the control terminal and outputs the selected signal as the signals DQ_INT[7:0]. In the flash memory chip C2, the signals DQS[7:0] are selected by the selection signal DIOSWAP_EN ("1") and are output as the signals DQ_INT[7:0].

In addition, in a case where the signals DQS[0:7] supplied to the DQ pins DQ0 to DQ7 of the flash memory chip C2 are write data, the signals DQS[0:7] do not pass through the connection change circuit 13 and are stored in the memory cells 17.

Figure 6:
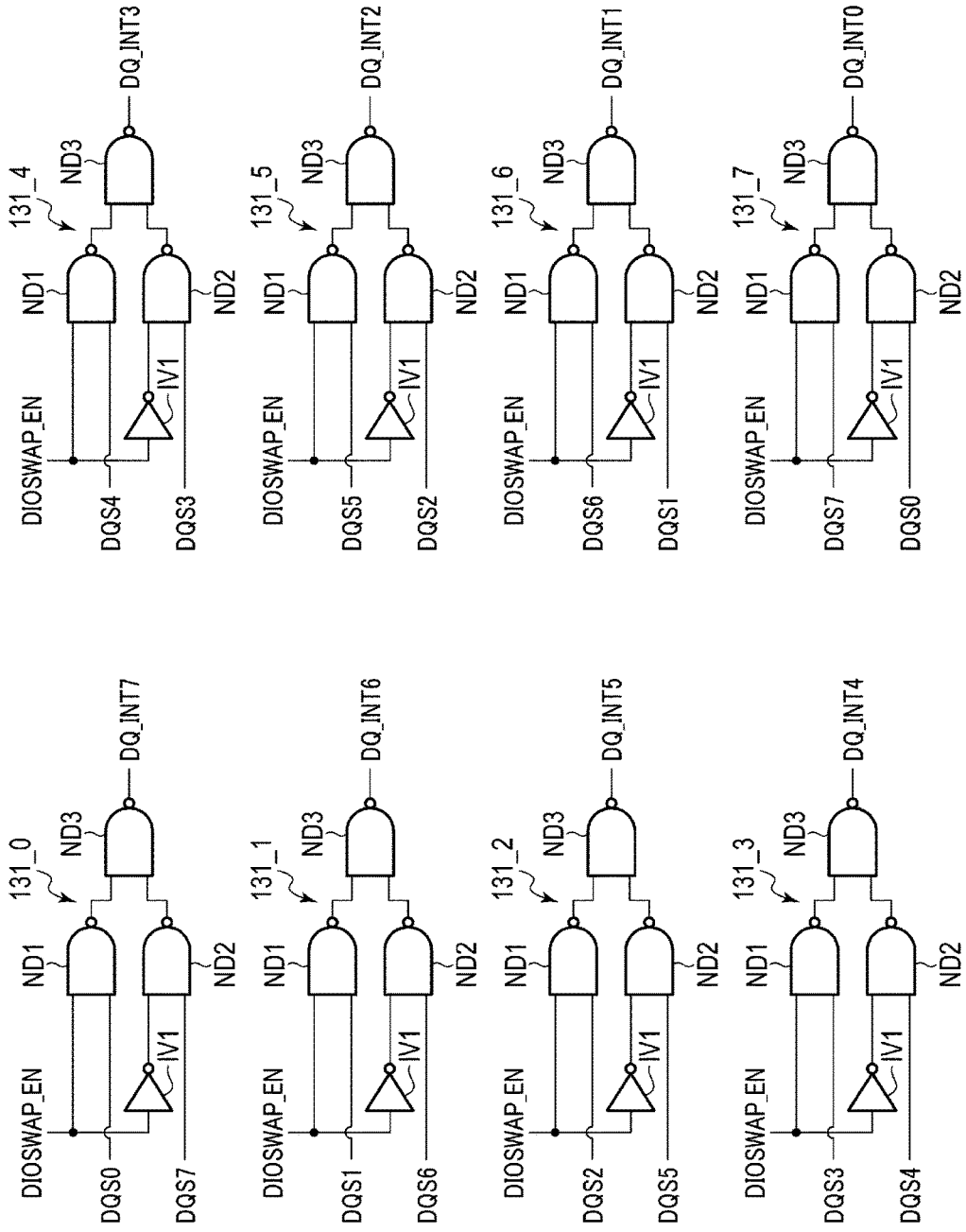
FIG. 6 is a circuit diagram of a connection change circuit when the data is input to the semiconductor memory device.

Next, a specific circuit example of the connection change circuit 13 used at the time of inputting data included in the flash memory chips C0 to C3 will be described with reference to FIG. 6. FIG. 6 is a circuit diagram illustrating a detailed configuration of the connection change circuit 13 used at the time of inputting data. As illustrated in the figure, the connection change circuit 13 includes selection circuits 131_0, 131_1, 131_2, . . . , 131_7. Each of the selection circuits 131_0 to 131_7 includes an inverter IV1 and a logical product NOT circuit (hereinafter, referred to as a NAND circuit) ND1, ND2, and ND3. Hereinafter, it is assumed that, in a case where the selection circuit 131 is referenced herein, the selection circuit 131 is referring to each of the selection circuits 131_0 to 131_7.

A connection relationship between the inputs and outputs of the selection circuits 131_0 to 131_7 is as follows. In the flash memory chip C0, the signals DQS0 to DQS7 are respectively input to first input terminals of the NAND circuits ND1 in the selection circuits 131_0 to 131_7, and the signals DQS7 to DQS0 are input to first input terminals of the NAND circuits ND2.

Specifically, in the selection circuit 131_0, the signal DQS0 is input to a first input terminal of the NAND circuit ND1. The signal DQS7 is input to a first input terminal of the NAND circuit ND2. The selection signal DIOSWAP_EN is input to a second input terminal of the NAND circuit ND1. The selection signal DIOSWAP_EN is input to a second input terminal of the NAND circuit ND2 through the inverter IV1. An output of the NAND circuit ND1 is input to a first input terminal of the NAND circuit ND3 and an output of the NAND circuit ND2 is input to a second input terminal of the NAND circuit ND3. When the selection signal DIOSWAP_EN goes to an "L" level, the signal DQ_INT7 (signal DQS7) is output from an output terminal of the NAND circuit ND3. When the selection signal DIOSWAP_EN goes to an "H", the signal DQ_INT0 (signal DQS0) is output.

In the selection circuit 131_1, the signal DQS1 is input to a first input terminal of the NAND circuit ND1 and the signal DQS6 is input to a first input terminal of the NAND circuit ND2. The selection signal DIOSWAP_EN is input to a second input terminal of the NAND circuit ND1, and the selection signal DIOSWAP_EN is input to a second input terminal of the NAND circuit ND2 through the inverter IV1. An output of the NAND circuit ND1 is input to a first input terminal of the NAND circuit ND3 and an output of the NAND circuit ND2 is input to a second input terminal of the NAND circuit ND3. When the selection signal DIOSWAP_EN goes to an "L", the signal DQ_INT6 (signal DQS6) is output from an output terminal of the NAND circuit ND3. When the selection signal DIOSWAP_EN goes to an "H", the signal DQ_INT1 (signal DQS1) is output.

In the same manner, the selection circuits 131_2 to 131_7 are configured as illustrated in FIG. 6, and the signals DQ_INT5 to DQ_INT0 or the signals DQ_INT0 to DQ_INT5 are respectively output from the selection circuits 131_2 to 131_7.

In addition, in the flash memory chip C2, the signals DQS7 to DQS0 are respectively input to the first input terminals of the NAND circuits ND1 in the selection circuits 131_0 to 131_7, and the signals DQS0 to DQS7 are respectively input to the first input terminals of the NAND circuits ND2. Other configurations are the same as in the flash memory chip C1 described above.

Figure 7:
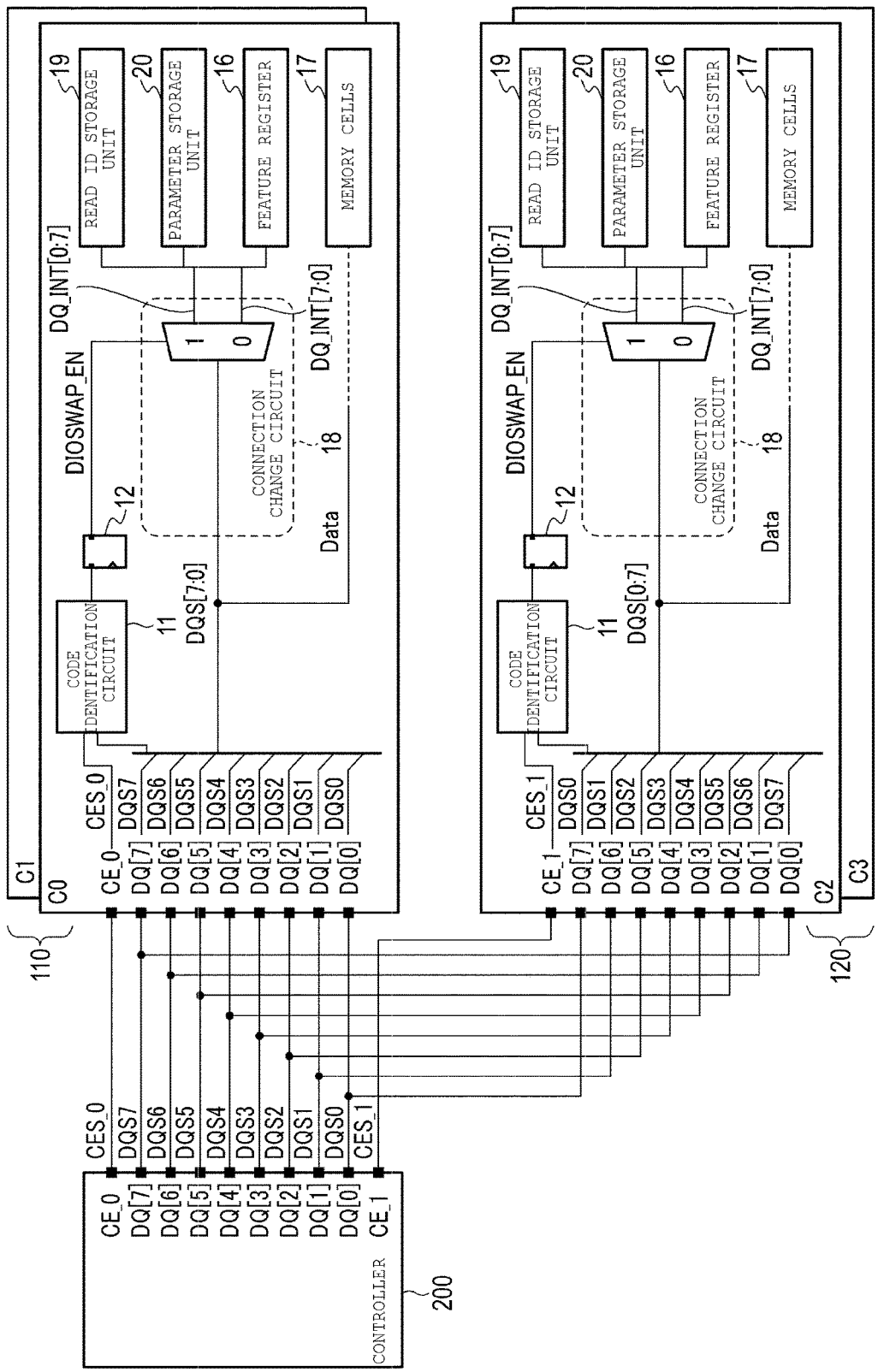
FIG. 7 is a diagram illustrating a circuit configuration used when data is output from the semiconductor memory device.

Next, a circuit configuration used when data is output from the semiconductor memory device 100 according to the first embodiment will be described. FIG. 7 is a diagram illustrating a circuit configuration used when data is output from the semiconductor memory device. The circuit configuration used when data is output is the same as the configuration illustrated in FIG. 5 except for the differences described herein.

Circuit configuration of the flash memory chip C0 in the normal package 110 and the flash memory chip C2 in the mirror package 120 will be described.

The flash memory chip C0 includes a chip enable pin CE_0, the DQ pins DQ0 to DQ7, the code identification circuit 11, the flip-flop 12, a connection change circuit 18, a read ID storage unit 19, a parameter storage unit 20, the feature register 16, the memory cells 17 of the NAND flash memory. The read ID storage unit 19 stores a chip ID code and the like. The parameter storage unit 20 stores various parameters. The flash memory chip C2 is the same as the flash memory chip C0 except that the flash memory chip C2 includes a chip enable pin CE_1 instead of the chip enable pin CE_0.

Next, a circuit connection and an operation of the flash memory chip C0 in the normal package 110 will be described.

The connection change circuit 18 includes, for example, a multiplexer. The signals DQ_INT[7:0] output from any of the read ID storage unit 19, the parameter storage unit 20, and the feature register 16 are input to the first input portion (channel 0) of the multiplexer. Signals DQ_INT[0:7] obtained by exchanging the signals DQ_INT[7:0] are input to a second input portion (channel 1) of the multiplexer, based on the connection rule (here, pattern 1) between the DQ pins of the mirror package 120 and the controller 200 (or the normal package 110). The selection signal DIO-SWAP_EN is input to a control terminal of the multiplexer. The multiplexer selects the signals DQ_INT[7:0] or the signals DQ_INT[0:7], according to the selection signal DIOSWAP_EN and outputs the selected signals to the DQ pins DQ0 to DQ7. In the flash memory chip C0, the signals DQ_INT[7:0] are selected by the selection signal DIO-SWAP_EN ("0") and are output as the signals DQS[7:0]. The signals DQS[7:0] output from the multiplexer are respectively output from the DQ pins DQ0 to DQ7 of the flash memory chip C0 to the DQ pins DQ0 to DQ7 of the controller 200.

In addition, in a case where data is read from the memory cells 17 of the flash memory chip C0, the read data is supplied to the DQ pins DQ0 to DQ7 of the flash memory chip C0 without passing through the connection change circuit 18. Furthermore, the read data is output from the DQ pins DQ0 to DQ7 of the flash memory chip C0 to the DQ pins DQ0 to DQ7 of the controller 200, respectively.

Next, a circuit connection and an operation of the flash memory chip C2 in the mirror package 120 will be described.

The signals DQ_INT [7:0] output from any one of the read ID storage unit 19, the parameter storage unit 20, and the feature register 16 are input to the first input portion (channel 0) of the multiplexer of the connection change circuit 18. The signals DQ_INT[0:7] obtained by exchanging the signals DQ_INT[7:0] are input to the second input portion (channel 1) of the multiplexer. In the flash memory chip C2, the multiplexer selects the signals DQ_INT[0:7] by using the selection signal DIOSWAP_EN ("1") and outputs the selected signal as the signals DQS[0:7]. The signals DQS[0:7] output from the multiplexer are output from the DQ pins DQ0 to DQ7 of the flash memory chip C2 to the DQ pins DQ7 to DQ0 of the controller 200, respectively. Since the DQ pins of the chip C2 and the DQ pins of the controller 200 are exchanged in this way, the signals DQS[0:7] output from the chip C2 are converted to the signals DQS[7:0] and are input to the controller 200.

In addition, in a case where data is reads from the memory cells 17 of the flash memory chip C2, the read data is supplied to the DQ pins DQ0 to DQ7 of the flash memory chip C2 without passing through the connection change circuit 18. Furthermore, the read data is output from the DQ pins DQ0 to DQ7 of the flash memory chip C2 to the DQ pins DQ7 to DQ0 of the controller 200, respectively.

Figure 8:
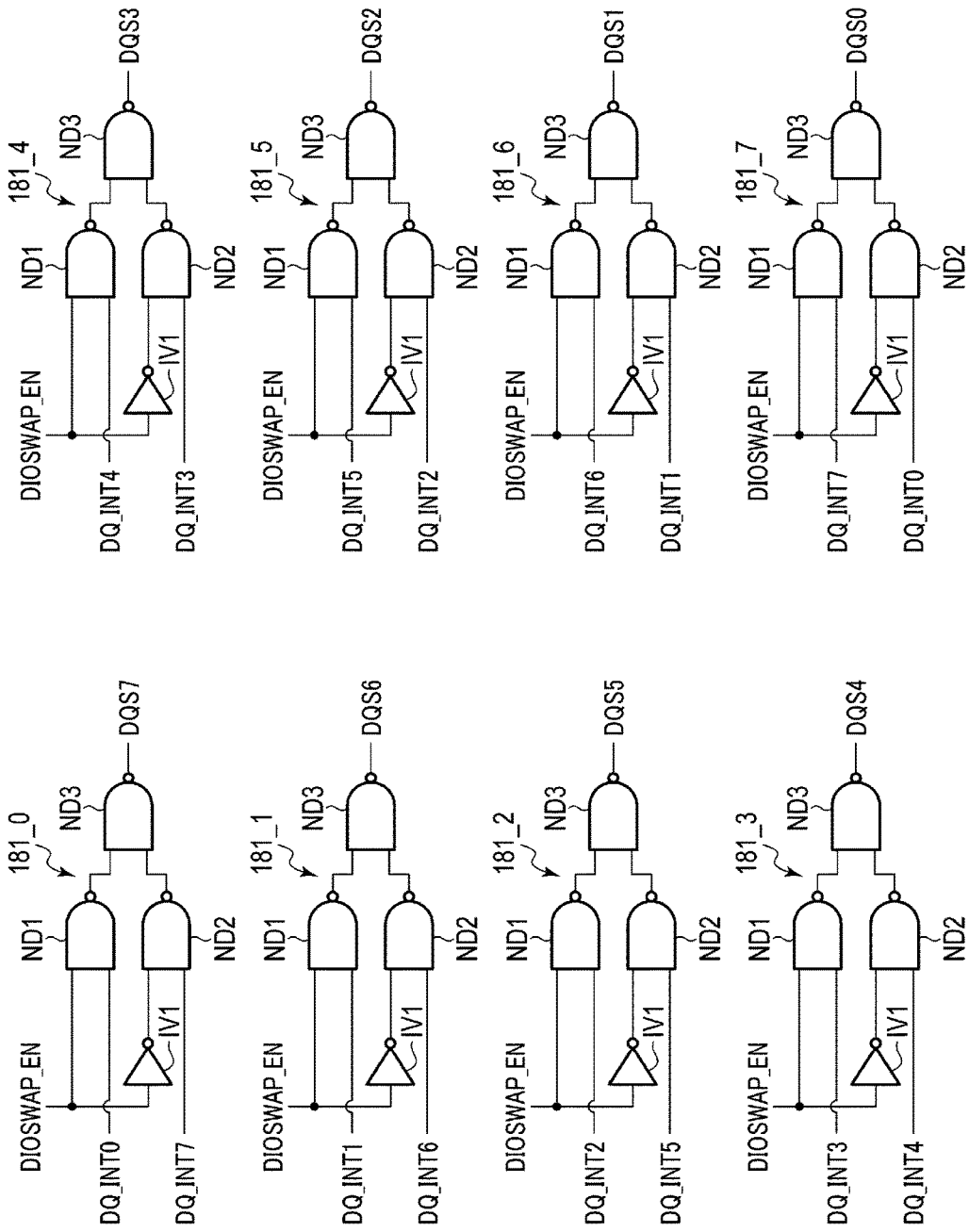
FIG. 8 is a circuit diagram of the connection change circuit when the data is output from the semiconductor memory device.

Next, a specific circuit example of the connection change circuit 18 used at the time of outputting data included in the flash memory chips C0 to C3 will be described with reference to FIG. 8. FIG. 8 is a diagram illustrating a detailed configuration of the connection change circuit 18 used at the time of outputting the data. As illustrated in the figure, the connection change circuit 18 includes selection circuits 181_0, 181_1, 181_2, . . . , 181_7. In the same manner as in the selection circuit 131, each of the selection circuits 181_0 to 181_7 includes the inverter IV1 and the NAND circuits ND1, ND2, and ND3, and has the same configuration.

A connection relationship between inputs and outputs of the selection circuits 181_0 to 181_7 is as follows. In the flash memory chip C0, the signals DQ_INT0 to DQ_INT7 are respectively input to the first input terminals of the NAND circuits ND1 in the selection circuits 181_0 to 181_7, and the signals DQ_INT7 to DQ_INT0 are input to the first input terminals of the NAND circuits ND2.

Specifically, in the selection circuit 181_0, the signal DQ_INT0 is input to a first input terminal of the NAND circuit ND1. The signal DQ_INT7 is input to a first input terminal of the NAND circuit ND2. The selection signal DIOSWAP_EN is input to a second input terminal of the NAND circuit ND1. The selection signal DIOSWAP_EN is input to a second input terminal of the NAND circuit ND2 through the inverter IV1. An output of the NAND circuit ND1 is input to a first input terminal of the NAND circuit ND3 and an output of the NAND circuit ND2 is input to a second input terminal of the NAND circuit ND3. When the selection signal DIOSWAP_EN goes to an "L" level, the signal DQS7 (signal DQ_INT7) is output from an output terminal of the NAND circuit ND3. When the selection signal DIOSWAP_EN goes to an "H" level, the signal DQS0 (signal DQ_INT0) is output.

In the selection circuit 181_1, the signal DQ_INT1 is input to a first input terminal of the NAND circuit ND1, and the signal DQ_INT6 is input to a first input terminal of the NAND circuit ND2. The selection signal DIOSWAP_EN is input to a second input terminal of the NAND circuit ND1, and the selection signal DIOSWAP_EN is input to a second input terminal of the NAND circuit ND2 through the inverter IV1. An output of the NAND circuit ND1 is input to a first input terminal of the NAND circuit ND3 and an output of the NAND circuit ND2 is input to a second input terminal of the NAND circuit ND3. When the selection signal DIOSWAP_EN goes to an "L" level, the signal DQS6 (signal DQ_INT6) is output from an output terminal of the NAND circuit ND3. When the selection signal DIOSWAP_EN goes to an "H" level, the signal DQS1 (signal DQ_INT1) is output.

In the same manner, the selection circuits 181_2 to 181_7 are configured as illustrated in FIG. 8, and the signals DQS5 to DQS0 or the signals DQS0 to DQS5 are respectively output from the selection circuits 181_2 to 181_7.

In addition, in the flash memory chip C2, the signals DQ_INT7 to DQ_INT0 are respectively input to the first input terminals of the NAND circuits ND1 in the selection circuits 181_0 to 181_7, and the signals DQ_INT0 to DQ_INT7 are respectively input to the first input terminals of the NAND circuits ND2. Other configurations are the same as in the flash memory chip C1 described above.

Here, the above-described connection change command will be described in detail. A code having a bit string symmetric with respect to the signal DQS is allocated to the connection change command. For example, in a case where a connection rule between the DQ pins of the controller 200 (or the normal package 110) and the DQ pins of the chip in the mirror package 120 is symmetric with respect to the center of the DQ pins DQ0 to DQ7 as in the pattern 1 illustrated in FIG. 4, codes that are symmetric with respect to the center of DQ[7:0] are used as illustrated in FIGS. 9A and 9B. If the symmetry code is transmitted from the controller 200 as a connection change command, even the mirror package 120 having the connection rule like the pattern 1 receives the symmetry code as the same code as before being converted, based on the connection rule. Accordingly, a circuit configuration of the command register in the flash memory chip can be simplified.

As illustrated in FIGS. 9A and 9B, if 1/0 are symmetrically arranged between high-level bits and low-level bits with respect to a line between DQ[4] and DQ[3], symmetry codes used in the first embodiment can be formed. In other words, the symmetry codes are the same codes, even if the high-level bits and the low-level bits are exchanged with each other by using the line between DQ[4] and DQ[3] as a boundary. As illustrated in FIG. 9C, in a case where the bit string has eight bits, 16 bit patterns (00h, 18h, 24h, 3Ch, 42h, 5Ah, 66h, 7Eh, 81h, 99h, A5h, BDh, C3h, DBh, E7h, FFh) exist in the symmetry codes. Hereinafter, the 16 bit patterns are referred to as a symmetry code A.

[1-4] Operation of First Embodiment

Figure 10:
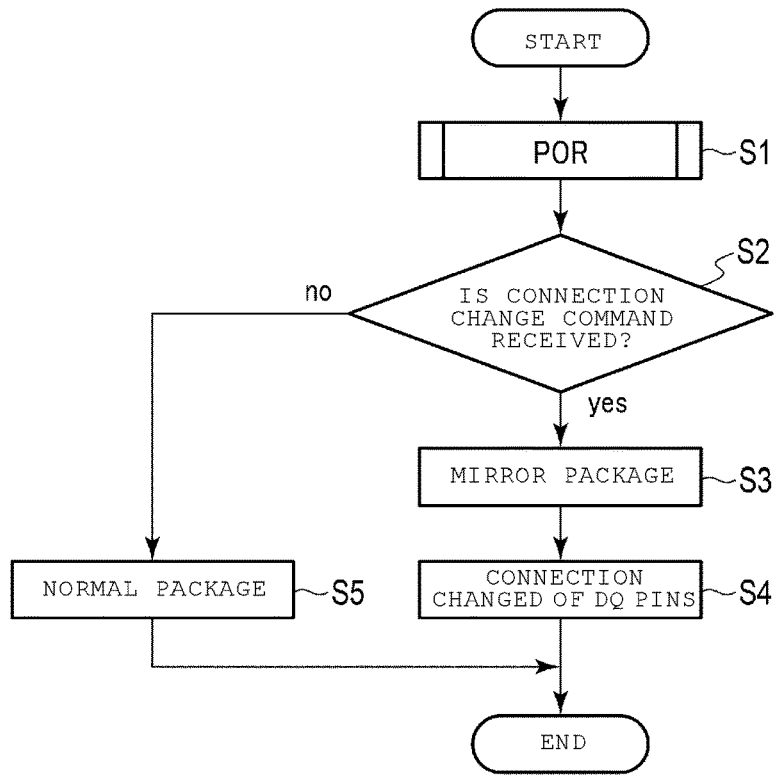
FIG. 10 is a flowchart illustrating an operation of changing connections between the DQ pins in the semiconductor memory device.

Next, an operation of a connection change of the DQ pins in the semiconductor memory device 100 according to the first embodiment will be described. FIG. 10 is a flowchart illustrating the operation of the connection change of the DQ pins in the semiconductor memory device. In the following embodiment, an operation of the flash memory chip C0 in the normal package 110 and an operation of the flash memory chip C2 in the mirror package 120 will be used as an example.

First, if the chip C0 in the normal package 110 and the chip C2 in the mirror package 120 are powered on, or if the chips C0 and C2 receive a command FFh from the controller 200, the chips C0 and C2 perform power on read (POR) (step S1).

Next, in a case where a connection change of the DQ pins of the chip C2 in the mirror package 120 are made, the chip C2 first receives the chip enable signal CES_1 asserted from the controller 200 and is enabled. The chip C0, on the other hand, receives the chip enable signal CES_0 negated from the controller 200 and is disabled. Thereby, only the chip C2 in the mirror package 120 is in a state of being able to receive a command.

Subsequently, the controller 200 transmits a connection change command (symmetry command A) to the chips C0 and C2. At this time, since being enabled, the chip C2 receives the connection change command (step S2) (yes).

If the chip C2 receives the connection change command, the chip C2 is regarded as being mounted on the mirror package 120 and the selection signal DIOSWAP_EN is asserted (step S3). If the selection signal DIOSWAP_EN is asserted, a connection change (hereinafter, also referred to as a mirror mode) of the DQ pins is made by the connection change circuit 13 in the chip C2 (step S4). In the mirror mode, the connection change circuit 13 exchanges the DQ pins, based on the connection rule (pattern 1) between the DQ pins of the controller 200 and the DQ pins of the chip C2 as illustrated in FIG. 6. In other words, an exchange between signals output from the DQ pins is made within the chip C2, such that a relation between an input signal from the controller 200 and the DQ pins of the chip C2 becomes the same as a relationship between an input signal from the controller 200 and the DQ pins of the chip C0.

Meanwhile, since the chip C0 is disabled, the connection change command transmitted from the controller 200 is not received (step S2) (no). In a case where the chip C0 does not receive the connection change command, the chip C0 is regarded as being mounted on the normal package 110 (step S5) and a connection change of the DQ pins is not made, and the operation ends.

Thereby, an operation of the connection change of the DQ pins in the flash memory chips C0 and C2 of the semiconductor memory device ends.

Figure 11:
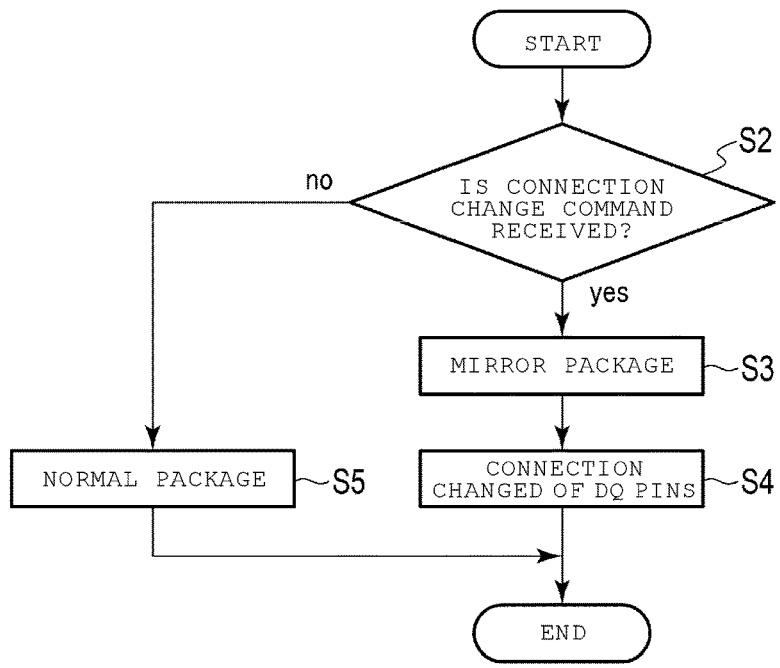
FIG. 11 is a flowchart illustrating another operation of changing the connections between the DQ pins in the semiconductor memory device.

The connection change of the DQ pins is made after the power on read is performed in FIG. 10, but the connection change of the DQ pins may be made before the power on read is performed. FIG. 11 is a flowchart illustrating the operation of the connection change of the DQ pins before the power on read is performed by the command FFh.

Before receiving the command FFh from the controller 200, the chips C0 and C2 receive the chip enable signals CES_0 and CES_1 from the controller 200. The chip C2 is enable by the asserted chip enable signal CES_1, and the chip C0 is disabled by the negated chip enable signal CES_0.

Thereafter, the controller 200 transmits the connection change command to the chips C0 and C2 (step S2). Processing of steps S2 to S5 illustrated in FIG. 11 is the same as the processing of FIG. 10. Thereby, the connection change of the DQ pins in the flash memory chips C0 and C2 may be made.

There is a case where it is desirable to access the chip C2 in the mirror package 120 before power on read is performed. In such a case, before the command FFh is input to the chips C0 and C2 to perform the power on read, the connection change command is input and the connection change of the DQ pins is made, as illustrated in FIG. 11. Thereby, if the chip C2 in the mirror package 120 is accessed thereafter, the same signal DQS which is the same as a signal input to the chip C0 in the normal package 110 can be input to the chip C2 in the mirror package 120.

Figure 12:
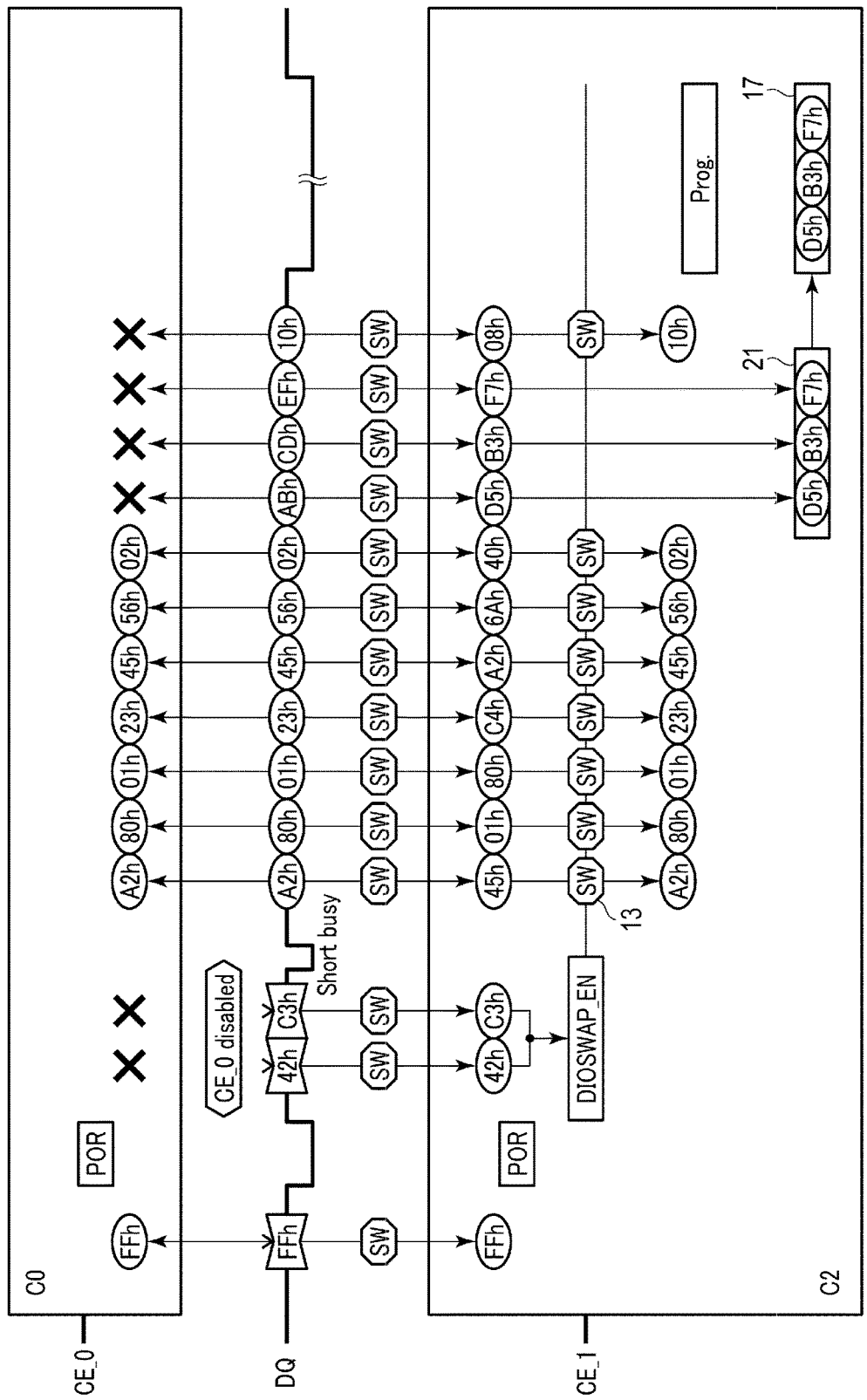
FIG. 12 is a diagram illustrating a write sequence of the semiconductor memory device.

Next, an example of a write command sequence of the semiconductor memory device 100 according to the first embodiment will be described. FIG. 12 is a diagram illustrating a write sequence of the normal package and the mirror package having a connection rule of pattern 1. Here, an example in which "a command 42h and an address C3h" are used as a connection change command will be described. Both the command 42h and the address C3h correspond to the symmetry code A.

First, the controller 200 transmits the command FFh to the DQ pins of the flash memory chip C0 in the normal package 110 and the flash memory chip C2 in the mirror package 120. Since the command FFh instructs the power on read. Since the FFh command corresponds to the symmetry command A, the command FFh is received by the chips C0 and C2 in the same manner. Thereby, the power on read (POR) is performed in each of the chip C0 in the normal package 110 and the chip C2 in the mirror package 120.

Next, the controller 200 asserts (or enables) the chip enable signal CES_1 to be transmitted to the chip enable pin CE_1 and negates (or disables) the chip enable signal CES_0 to be transmitted to the chip enable pin CE_0. Thereby, the chip C2 is enabled and the chip C0 is disabled.

Subsequently, in order to set the chip C2 in the mirror package 120 to a mirror mode, the controller 200 transmits "the command 42h and the address C3h" to the DQ pins of the chips C0 and C2. At this time, since being enabled, the chip C2 receives "the command 42h and the address C3h". Meanwhile, since being disabled, the chip C0 does not receive "the command 42h and the address C3h".

Since corresponding to the symmetry command A, "the command 42h and the address C3h" are received by the chip C2 in the mirror package 120 as the same code. If "the command 42h and the address C3h" are received, the selection signal DIOSWAP_EN is asserted in the chip C2 in the mirror package 120, and the mirror mode is set. While being set to the mirror mode, that is, while the connection change of the DQ pins is made in the connection change circuit 13, busy ("L") is output to a ready/busy (RB) pin, and if the connection change of the DQ pins ends, the RB pin returns to ready ("H"). Here, a ready/busy signal is illustrated in a signal portion input to the DQ pins for the sake of convenience, but actually, the ready/busy signal is input to the RB pin different from the DQ pins. The same applies to subsequent descriptions of FIG. 13, FIG. 28, and the like.

Next, the controller 200 executes a binary program for the chip C2 in the mirror package 120. First, the controller 200 transmits a command A2h to the DQ pins of the chips C0 and C2. The command A2h indicates an SLC (Single Level Cell) mode. The command A2h transmitted from the controller 200 is converted into a command 45h and is received at the DQ pins of the chip C2, based on a connection rule (pattern 1) between the DQ pins of the controller 200 and the DQ pins of the chip C2. However, the command 45h is further converted by the connection change circuit 13 in the chip C2 and returns to the command A2h.

Subsequently, the controller 200 transmits an address input command 80h to the DQ pins of the chips C0 and C2. In the same manner, the command 80h transmitted from the controller 200 is converted into a command 01h and is received at the DQ pins of the chip C2, based on the connection rule (pattern 1). However, the command 01h is further converted by the connection change circuit 13 and returns to the command 80h.

Following transmission of the command 80h, the controller 200 transmits addresses of 5 cycles to the DQ pins of the chips C0 and C2. In the same manner, the addresses (01h, 23h, 45h, 56h, and 02h) of five cycles transmitted from the controller 200 are converted into addresses (80h, C4h, A2h, 6Ah, and 40h) and are received by the DQ pins of the chip C2, based on the connection rule (pattern 1). However, the addresses are further converted by the connection change circuit 13 and return to the addresses (01h, 23h, 45h, 56h, and 02h).

Here, the chip address 02h is assigned to a fifth cycle of the addresses. Since the address 02h corresponding to the chip C2 in the mirror package 120 is input, the chip C2 in the mirror package 120 is in a selection state and the chip C0 in the normal package 110 is in a non-selection state.

Subsequently, the controller 200 transmits write data (ABh, CDh, and EFh) to the DQ pins of the chips C0 and C2. In the same manner, the write data (ABh, CDh, and EFh) transmitted from the controller 200 is converted into write data (D5h, B3h, and F7h) and is received at the DQ pins of the chip C2, based on the connection rule (pattern 1). Thereafter, the converted write data (D5h, B3h, and F7h) is stored in a page buffer 21. Meanwhile, since being in the non-selection state, the chip C0 in the normal package 110 does not receive the write data (ABh, CDh, and EFh).

Next, the controller 200 transmits a write execution command 10h to the DQ pins of the chips C0 and C2. In the same manner, the command 10h transmitted from the controller 200 is converted into a command 08h and is received at the DQ pin of the chip C2, based on the connection rule (pattern 1). However, the command 08h is further converted by the connection change circuit 13 and returns to the command 10h. Thereby, the write data (D5h, B3h, and F7h) stored in the page buffer 21 is written into the memory cells 17 by the program sequence. While the write data is written to the memory cells 17, busy is output to the ready/busy (RB) pin. When writing end, the RB pin returns to ready.

Meanwhile, since the chip CO in the normal package 110 is in a non-selection state, the write execution command 10h is not received.

As described above, the write command sequence of the semiconductor memory device 100 end.

Figure 13:
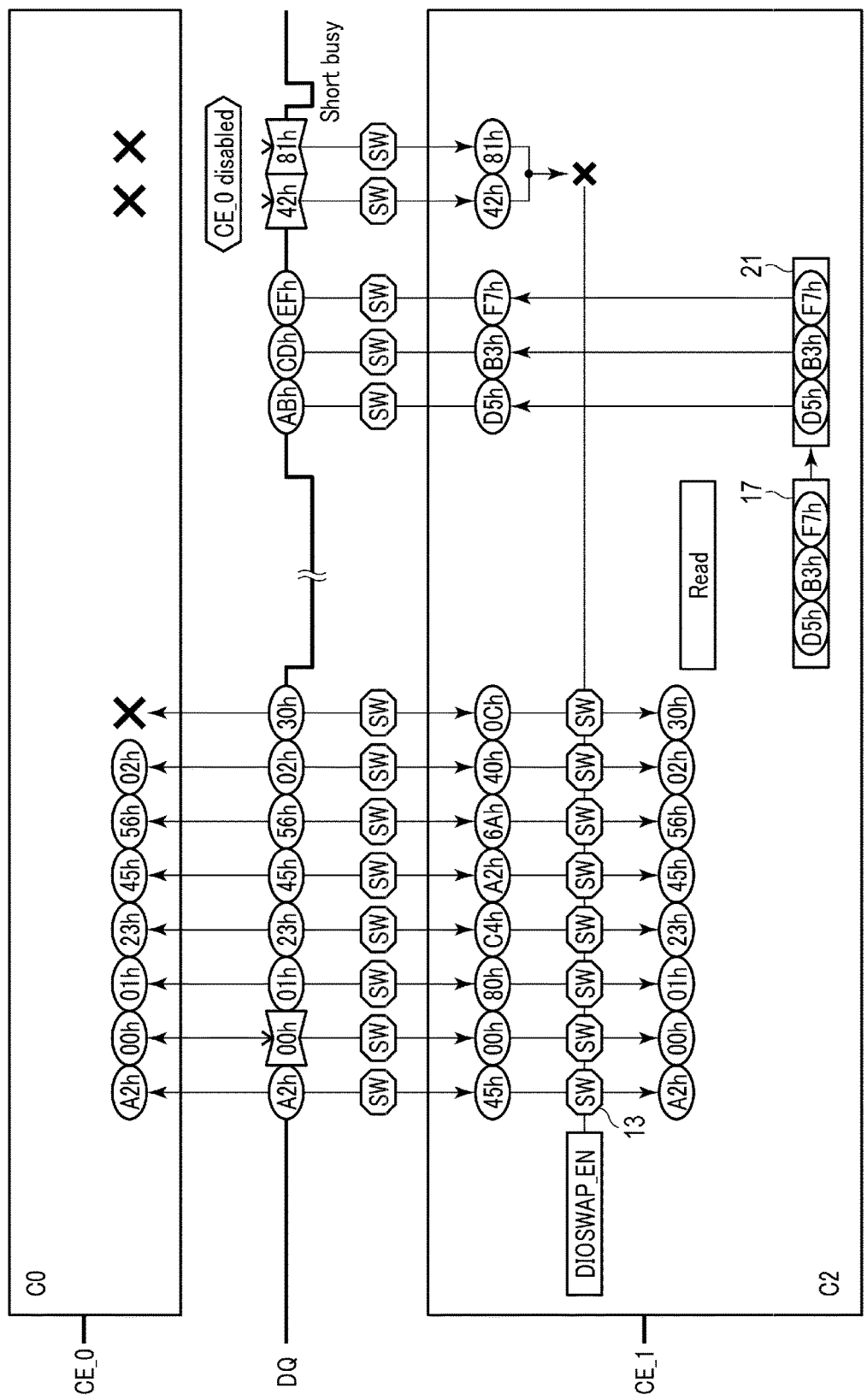
FIG. 13 is a diagram illustrating a sequence of reading and mirror mode release of the semiconductor memory device.

Next, an example of a read command sequence of the semiconductor memory device 100 according to the first embodiment will be described. FIG. 13 is a diagram illustrating a sequence of reading and mirror mode release of a normal package and a mirror package having a connection rule of pattern 1. In the example of FIG. 12, the connection change command is input to the chips C0 and C2 to set the mirror mode, but when being erroneously set to the mirror mode, a command for exiting or releasing the mirror mode is prepared. Here, it is assumed that the chip C2 is previously set in the mirror mode, and an example in which "a command 42h and an address 81h" are used as a connection change command for exiting the mirror mode will be described.

First, the controller 200 transmits a command A2h indicating an SLC mode to the DQ pins of the flash memory chips C0 and C2. In the same manner, the command A2h transmitted from the controller 200 is converted into a command 45h, based on the connection rule (pattern 1). However, the command 45h is further converted by the connection change circuit 13 and returns to the command A2h.

Next, the controller 200 transmits an address input command 00h to the DQ pins of the chips C0 and C2. The command 00h transmitted from the controller 200 corresponds to the symmetry command A, but, in the same manner, the command is converted into the command 00h, based on the connection rule (pattern 1), is further converted by the connection change circuit 13, and returns to the command 00h.

Following transmission of the command 00h, the controller 200 transmits addresses (01h, 23h, 45h, 56h, and 02h) of five cycles to the DQ pins of the chips C0 and C2. In the same manner, the addresses of five cycles transmitted from the controller 200 are converted into addresses (80h, C4h, A2h, 6Ah, and 40h), based on the connection rule (pattern 1), but are further converted by the connection change circuit 13, and returns to the addresses (01h, 23h, 45h, 56h, and 02h).

Here, the chip address 02h is assigned to a fifth cycle of the addresses. Since the address 02h corresponding to the chip C2 in the mirror package 120 is input, the chip C2 in the mirror package 120 is in a selection state and the chip C0 in the normal package 110 is in a non-selection state.

Subsequently, the controller 200 transmits a read execution command 30h to the DQ pins of the chips C0 and C2. In the same manner, the command 30h transmitted from the controller 200 is converted into a command 0Ch, based on the connection rule (pattern 1), but the command is further converted by the connection change circuit 13 and returns to the command 30h. Thereby, in the chip C2 in the mirror package 120, reading is executed and data (D5h, B3h, and F7h) stored in the memory cells 17 is read into the page buffer 21. Busy is output to the ready/busy (RB) pin while data is read from the memory cells 17. If the reading ends, the RB pin returns to ready.

Furthermore, the data (D5h, B3h, and F7h) read into the page buffer 21 is output from the DQ pins DQ0 to DQ7 of the flash memory chip C2 to the DQ pins DQ7 to DQ0 of the controller 200. The data output from the DQ pin of the chip C2 is converted into data (ABh, CDh, and EFh) and is received at the DQ pins of the controller 200, based on the connection rule (pattern 1) between the DQ pins of the controller 200 and the DQ pins of the chip C2. That is, if the data (ABh, CDh, and EFh) is written to the memory cells 17 of the flash memory chip C2 in the write sequence illustrated in FIG. 12, the converted data (D5h, B3h, and F7h) is written to the memory cells 17. However, if the converted data written to the memory cells 17 is read out to the controller 200 in the reading sequence illustrated in FIG. 13, the converted data returns to the correct data (ABh, CDh, and EFh).

Since being in a non-selection state, the chip in the normal package 110 does not receive the read execution command 30h.

Next, in a command sequence for releasing the mirror mode of the chip C2 in the mirror package 120, the controller 200 first asserts the chip enable signal CES_1 and negates the chip enable signal CES_0.

Subsequently, the controller 200 transmits "a command 42h and an address 81h" to the DQ pins of the chips C0 and C2. At this time, since being in a selection state, the chip C2 receives "the command 42h and the address 81h", but since being in a non-selection state, the chip C0 does not receive "the chip 42h and the address 81h".

Since "the command 42h and the address 81h" transmitted from the controller 200 correspond to the symmetry command A, the chip C2 receives the same code as it is. Thereby, in the chip C2 in the mirror package 120, the selection signal DIOSWAP_EN is negated and the mirror mode is released. While the mirror mode is released, that is, while the connection change of the DQ pins is released in the connection change circuit 13, busy is output to the ready/busy (RB) pin, and if the connection change of the DQ pins is released, the RB pin returns to ready.

As described above, the command sequences of reading and mirror mode release of the semiconductor memory device 100 ends.

[1-5] Effects of First Embodiment

According to the first embodiment, it is possible to provide a double-side mounted semiconductor memory device which can increase data transfer speed.

Hereinafter, the effects will be described in detail. In a double-side mounted semiconductor memory device in which the same packages are mounted on both surfaces of a substrate, in a case where a configuration is used in which DQ pins are commonly used by a normal package on a front surface of the substrate and a mirror package on a rear surface), wires for interconnecting the common DQ pins of both packages may become longer in some cases. The common DQ pin indicates a pin having the same pin number and the same circuit function.

Since the mirror package is obtained by rotating the same package as the normal package by 180°, in a case where positions of the DQ pins are different from positions of the DQ pins of the normal package and are connected in a direction perpendicular to a surface of a substrate, the common DQ pins cannot be connected. Accordingly, in a case where data is transmitted from the controller, the data received by the normal package differs from data received by the mirror package.

Therefore, in the first embodiment, a connection change circuit for changing a connection between the DQ pins of a chip on the mirror package 120 is provided. The connection change circuit exchanges the DQ pins inside the chip on the mirror package 120, based on a connection rule between the DQ pins of the normal package 110 (or the controller 200) and the DQ pins of the mirror package 120 (or the chip in the mirror package 120). Thereby, even in a case where the DQ pins of the normal package 110 and the mirror package 120 mounted on both surfaces of the substrate are connected in a direction perpendicular to surfaces of the substrate, it is possible to receive the same data by the normal package 110 and the mirror package 120.

In addition, in the first embodiment, a connection change circuit is not disposed between DQ pins and memory cells of chips in the normal package 110 and the mirror package 120, that is, in input/output paths of data. Accordingly, in the chip in the mirror package 120, converted data is written to the memory cell as it is. Therefore, even in a case where the controller 200 writes the same data to a chip in the normal package 110 and a chip in the mirror package 120, different data is written to the memory cells of each chip. However, in a case where data written to the chip in the mirror package 120 is read to the controller 200, the data is converted again and restored to original data. Thus, in a case of viewing from the controller 200, the same data is output from the normal package 110 and the mirror package 120.

Unlike an address and a command, an internal operation of the chip is not affected by values of data input to the normal package 110 and the mirror package 120. In the first embodiment, the connection change circuit may not be disposed in the input/output paths of data in this manner, and thus, the data input/output speed is not affected.

As described above, according to the first embodiment, since the DQ pins of the normal package 110 and the mirror package 120 mounted on both surfaces of a substrate can be connected at a short distance (for example, the shortest distance), the data transfer speed can increase.

[2] Second Embodiment

A semiconductor memory device according to a second embodiment will be described. In the second embodiment, a combination of a command including a code (hereinafter, referred to as a symmetry code B) with better symmetry than symmetry code A and an address including the symmetry code B illustrated in FIG. 9C is used as a connection change command. Furthermore, the connection change commands are used in association with a double-side mounted semiconductor memory device with various connection rules. A semiconductor memory device including a mirror package having patterns 2 to 5 is exemplified as an example of the various connection rules. A structure and a circuit configuration of the semiconductor memory device according to the second embodiment are the same as in the first embodiment described above, except for the connection rule of the DQ pins of the normal package and the mirror package, and the connection change circuit.

FIG. 14A is a diagram illustrating the symmetry code B used for the semiconductor memory device according to the second embodiment. As illustrated in FIG. 14A, the symmetry code B also indicates codes symmetric with respect to a symmetric axis between DQ[6] and DQ[5] and a symmetric axis between DQ[2] and DQ[1] in addition to asymmetric axis between DQ[4] and DQ[3]. As illustrated in FIG. 14B, the symmetry code B has four bit patterns (00h, 66h, 99h, FFh) in a bit string of eight bits.

[2-1] Circuit Configuration of Semiconductor Memory Device

Figure 15:
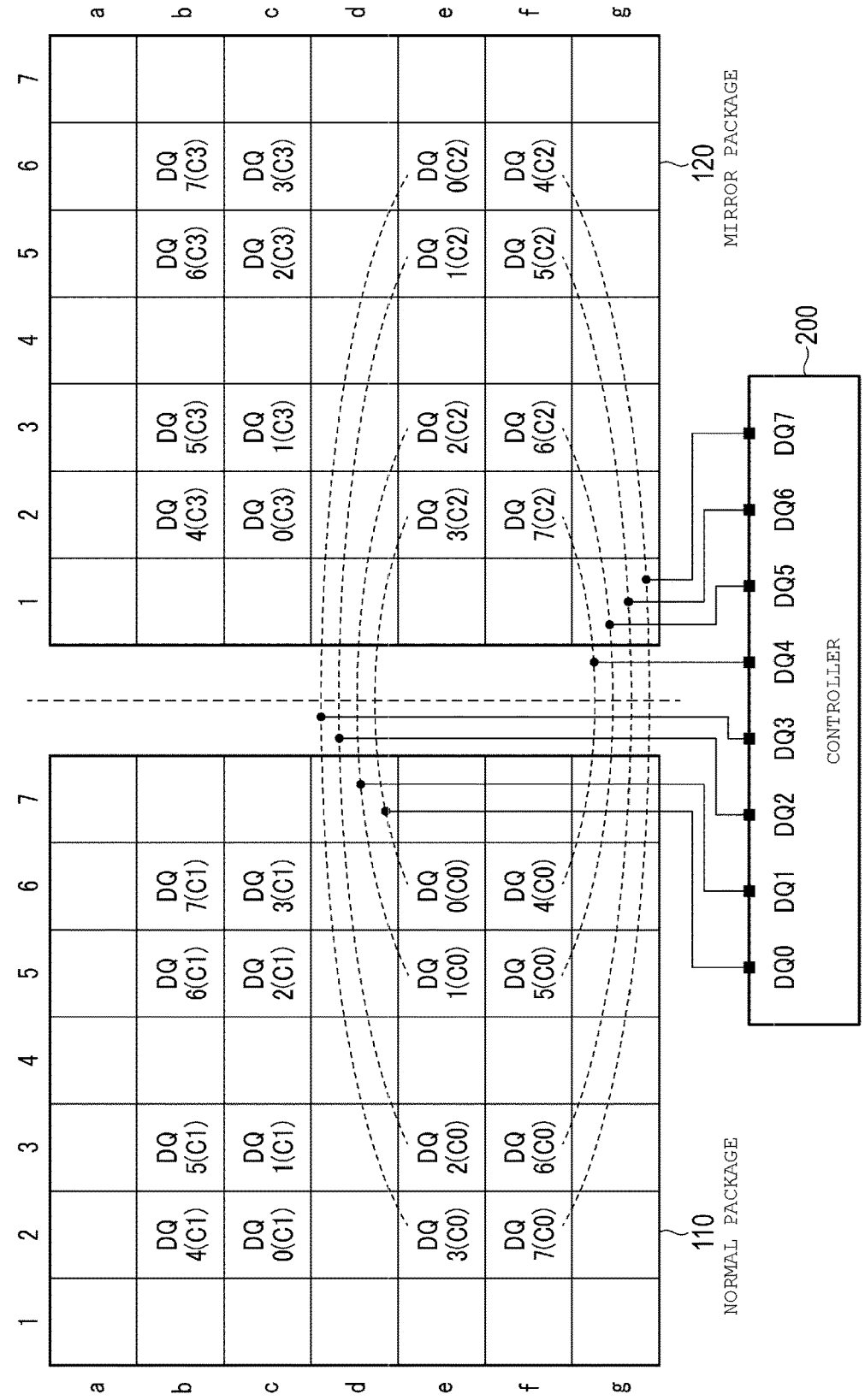
FIG. 15 is a plan diagram illustrating an array of DQ pins of a normal package and a mirror package according to the second embodiment.

Next, array of the DQ pins of pattern 2 in the semiconductor memory device according to the second embodiment will be described with reference to FIGS. 15 and 16. FIG. 15 is a plan diagram illustrating the array of the DQ pins of the normal package 110 and the mirror package 120.

Dashed lines that connect, for example, DQ0 (C0) to DQ3 (C2), DQ1 (C0) to DQ2 (C2), DQ2 (C0) to DQ1 (C2), DQ3 (C0) to DQ0 (C2), DQ4 (C0) to DQ7 (C2), DQ5 (C0) to DQ6 (C2), DQ6 (C0) to DQ5 (C2), and DQ7 (C0) to DQ4 (C2), between the DQ pins of the normal package 110 and the DQ pins of the mirror package 120 in FIG. 15 indicate that the DQ pins are respectively connected to each other. Furthermore, solid lines connected to the dashed lines indicate that the DQ pins of both the packages 110 and 120 are respectively connected to the DQ pins DQ0, DQ1, DQ2, . . . , DQ7 of the controller 200.

For example, DQ0 (C0), DQ1 (C0), DQ5 (C0), and DQ4 (C0) are respectively disposed at pin coordinates 6-e, 5-e, 5-f, and 6-f of the normal package 110. The DQ0 (C0), DQ1 (C0), DQ5 (C0), and DQ4 (C0) are connected to pin coordinates 2-e, 3-e, 3-f, and 2-f of the mirror package 120, and respectively correspond to DQ3 (C2), DQ2 (C2), DQ6 (C2), and DQ7 (C2) of the mirror package 120.

Connection rules of the DQ pins of the normal package 110, the mirror package 120, and the controller 200 illustrated in FIG. 15 will be described with reference to FIG. 16 for easier understanding. FIG. 16 is a diagram illustrating only extracted number of the DQ pins of the controller 200 and the normal package 110 and extracted numbers of the DQ pins of the mirror package 120.

Figure 16:
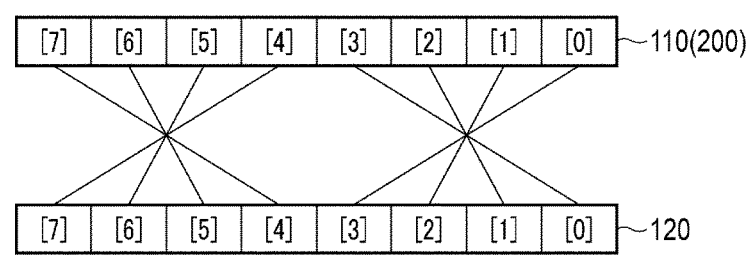
FIG. 16 is a diagram illustrating extracted numbers of the DQ pins of a controller, the normal package, and the mirror package illustrated in FIG. 15.

As illustrated in FIG. 16, DQ0 of the controller 200 and the normal package 110 are connected to DQ3 of the mirror package 120. In the same manner, DQ1 is connected to DQ2, DQ2 is connected to DQ1, DQ3 is connected to DQ0, DQ4 is connected to DQ7, DQ5 is connected to DQ6, DQ6 is connected to DQ5, and DQ7 is connected to DQ4.

Figure 17:
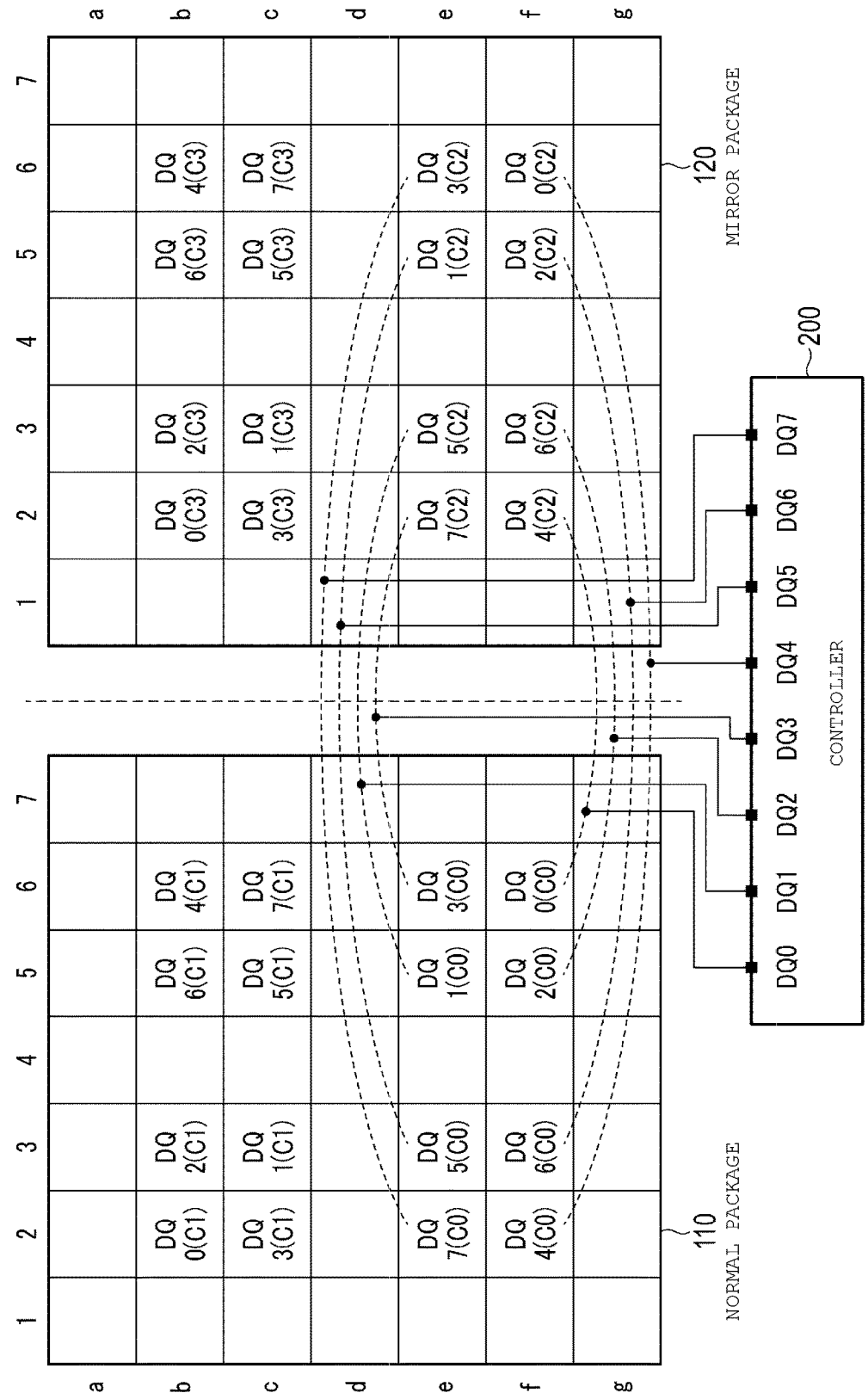
FIG. 17 is a plan diagram illustrating an array of the DQ pins of the normal package and the mirror package according to the second embodiment.

Next, an array of the DQ pins of pattern 3 in the semiconductor memory device according to the second embodiment will be described with reference to FIGS. 17 and 18. FIG. 17 is a plan diagram illustrating the array of the DQ pins of the normal package 110 and the mirror package 120.

Dashed lines that connect, for example, DQ0 (C0) to DQ4 (C2), DQ1 (C0) to DQ5 (C2), DQ2 (C0) to DQ6 (C2), DQ3

(C0) to DQ7 (C2), DQ4 (C0) to DQ0 (C2), DQ5 (C0) to DQ1 (C2), DQ6 (C0) to DQ2 (C2), and DQ7 (C0) to DQ3 (C2) between the DQ pins of the normal package 110 and the DQ pins of the mirror package 120 in FIG. 17 indicate that the DQ pins are respectively connected to each other. Furthermore, solid lines connected to the dashed lines indicate that the DQ pins of both the packages 110 and 120 are respectively connected to the DQ pins DQ0 to DQ7 of the controller 200.

For example, DQ3 (C0), DQ1 (C0), DQ2 (C0), and DQ0 (C0) are disposed at pin coordinates 6-e, 5-e, 5-f, and 6-f of the normal package 110. DQ3 (C0), DQ1 (C0), DQ2 (C0), and DQ0 (C0) are respectively connected to pin coordinates 2-e, 3-e, 3-f, and 2-f of the mirror package 120, and respectively correspond to DQ7 (C2), DQ5 (C2), DQ6 (C2), and DQ4 (C2) of the mirror package 120.

Connection rules of the DQ pins of the normal package 110, the mirror package 120, and the controller 200 illustrated in FIG. 17 are described with reference to FIG. 18 for easier understanding. FIG. 18 is a diagram illustrating only extracted numbers of the DQ pins of the controller 200 and the normal package 110 and extracted numbers of the DQ pins of the mirror package 120.

Figure 18:
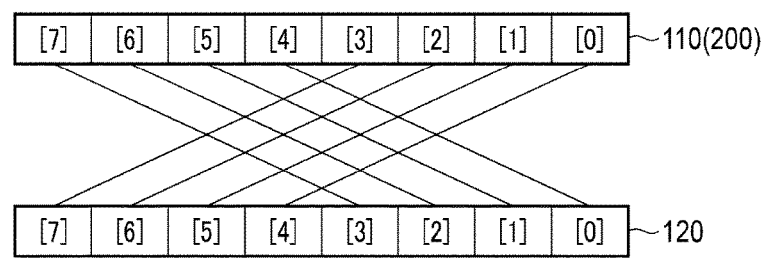
FIG. 18 is a diagram illustrating extracted numbers of the DQ pins of the controller, the normal package, and the mirror package illustrated in FIG. 17.

As illustrated in FIG. 18, DQ0 of the controller 200 and the normal package 110 are connected to DQ4 of the mirror package 120. In the same manner, DQ1 is connected to DQ5, DQ2 is connected to DQ6, DQ3 is connected to DQ7, DQ4 is connected to DQ0, DQ5 is connected to DQ1, DQ6 is connected to DQ2, and DQ7 is connected to DQ3.

Figure 19:
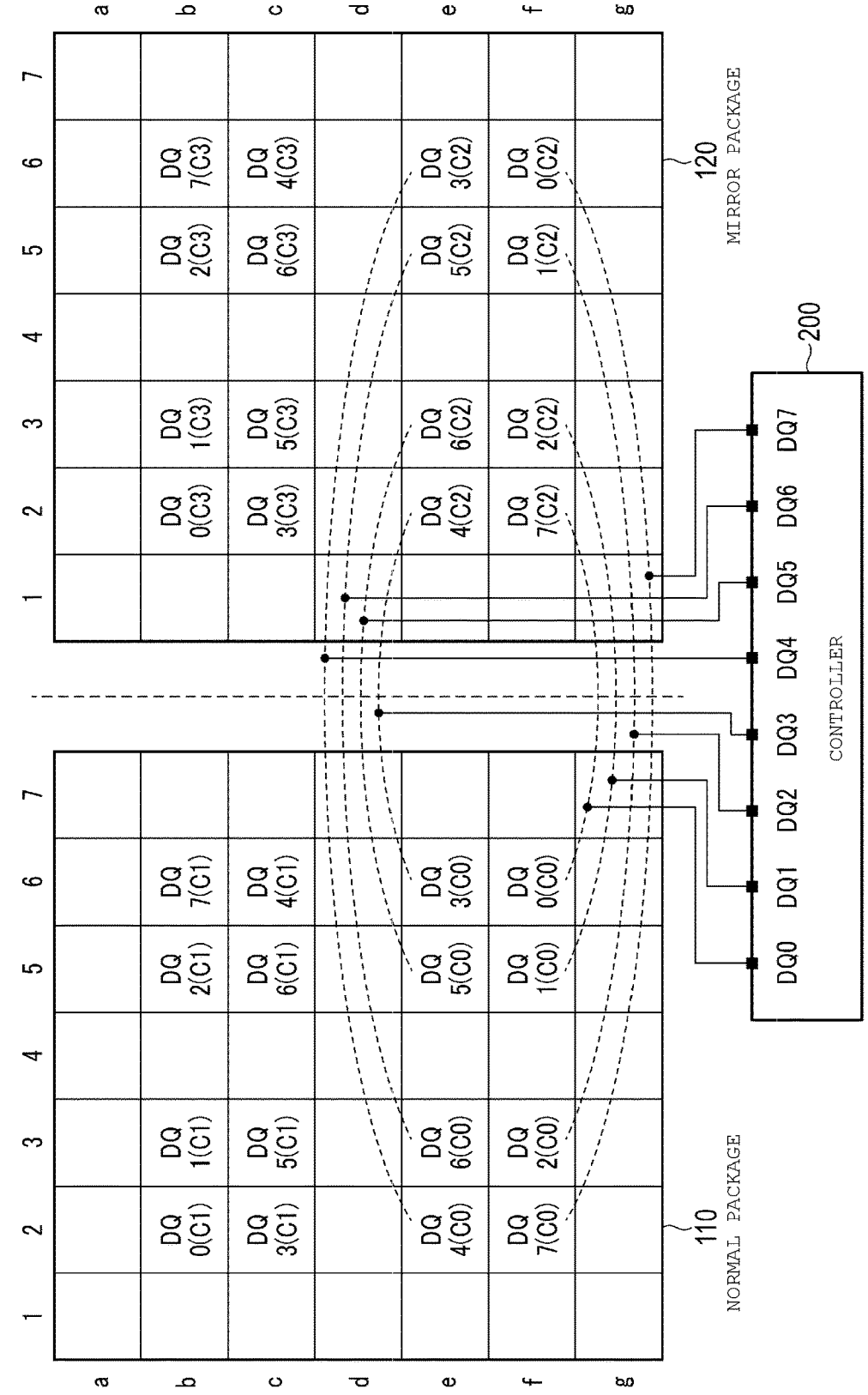
FIG. 19 is a plan diagram illustrating an array of the DQ pins of the normal package and the mirror package according to the second embodiment.

Next, array of the DQ pins of pattern 4 in the semiconductor memory device according to the second embodiment will be described with reference to FIGS. 19 and 20. FIG. 19 is a plan diagram illustrating the array of the DQ pins of the normal package 110 and the mirror package 120.

Dashed lines that connect, for example, DQ0 (C0) to DQ7 (C2), DQ1 (C0) to DQ2 (C2), DQ2 (C0) to DQ1 (C2), DQ3 (C0) to DQ4 (C2), DQ4 (C0) to DQ3 (C2), DQ5 (C0) to DQ6 (C2), DQ6 (C0) to DQ5 (C2), and DQ7 (C0) and DQ0 (C2), between the DQ pins of the normal package 110 and the DQ pins of the mirror package 120 in FIG. 19 indicate that the DQ pins are respectively connected to each other. Furthermore, solid lines connected to the dashed lines indicate that the DQ pins of both the packages 110 and 120 are respectively connected to the DQ pins DQ0 to DQ7 of the controller 200.

For example, DQ3 (C0), DQ5 (C0), DQ1 (C0), and DQ0 (C0) are disposed at pin coordinates 6-e, 5-e, 5-f, and 6-f of the normal package 110. DQ3 (C0), DQ5 (C0), DQ1 (C0), and DQ0 (C0) are respectively connected to pin coordinates 2-e, 3-e, 3-f, and 2-f of the mirror package 120, and respectively correspond to DQ4 (C2), DQ6 (C2), DQ2 (C2), and DQ7 (C2) of the mirror package 120.

Connection rules of the DQ pins of the normal package 110, the mirror package 120, and the controller 200 illustrated in FIG. 19 will be described with reference to FIG. 20 for easier understanding. FIG. 20 is a diagram illustrating only extracted numbers of the DQ pins of the controller 200 and the normal package 110 and extracted number of the DQ pins of the mirror package 120.

Figure 20:
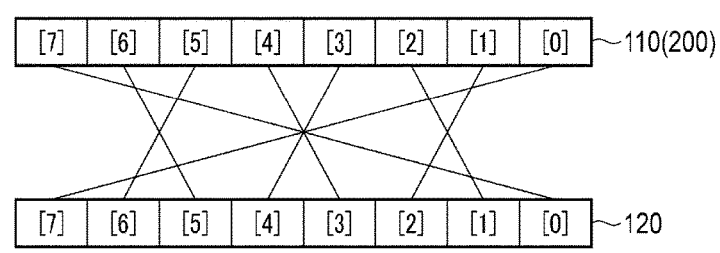
FIG. 20 is a diagram illustrating extracted numbers of the DQ pins of the controller, the normal package, and the mirror package illustrated in FIG. 19.

As illustrated in FIG. 20, DQ0 of the controller 200 and the normal package 110 are connected to DQ7 of the mirror package 120. In the same manner, DQ1 is connected to DQ2, DQ2 is connected to DQ1, DQ3 is connected to DQ4, DQ4 is connected to DQ3, DQ5 is connected to DQ6, DQ6 is connected to DQ5, and DQ7 is connected to DQ0.

Figure 21:
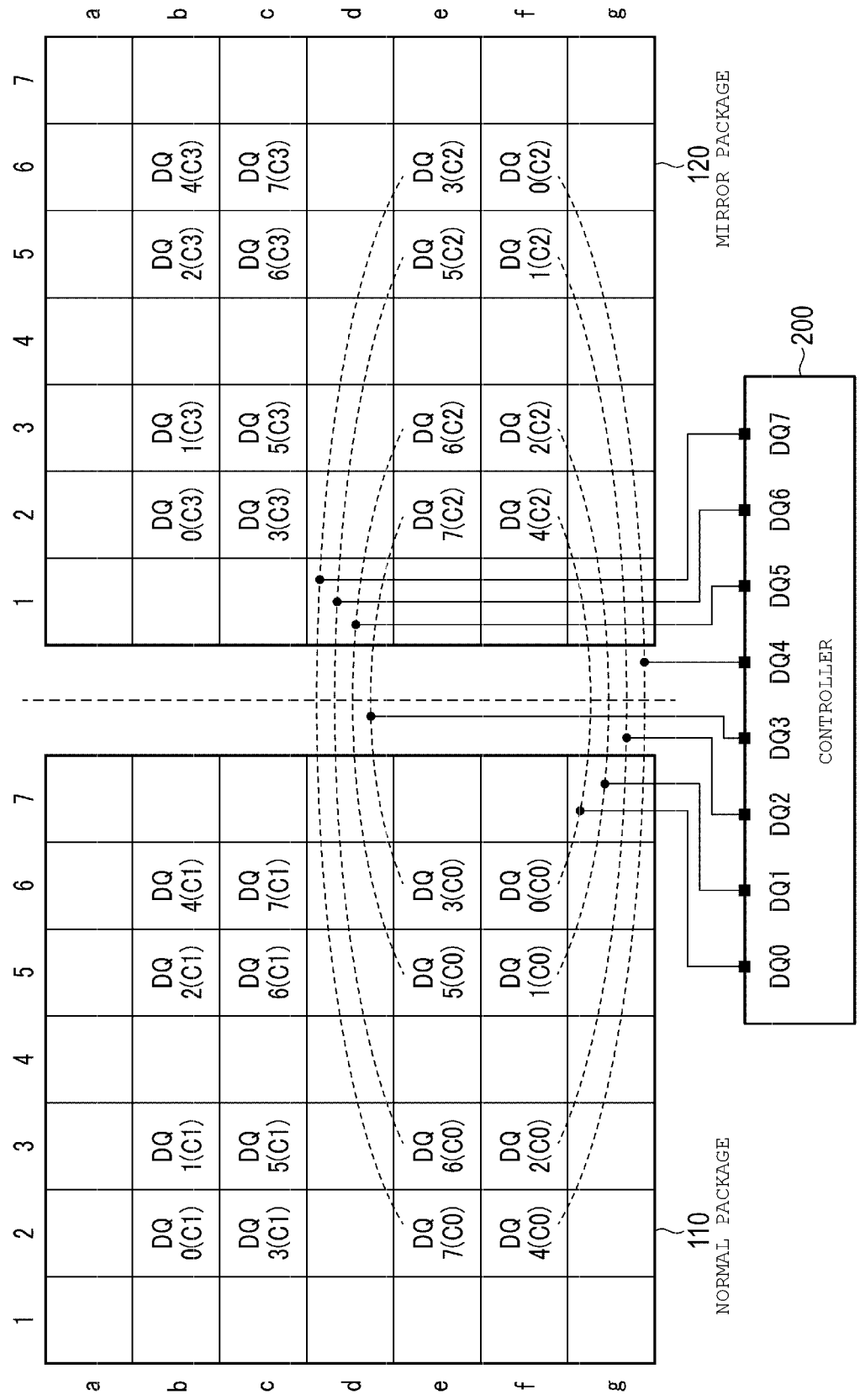
FIG. 21 is a plan diagram illustrating an array of the DQ pins of the normal package and the mirror package according to the second embodiment.

Next, an array of the DQ pins of pattern 5 in the semiconductor memory device according to the second embodiment will be described with reference to FIG. 21 and FIG. 22. FIG. 21 is a plan diagram illustrating the array of the DQ pins of the normal package 110 and the mirror package 120.

Dashed lines that connect, for example, DQ0 (C0) to DQ4 (C2), DQ1 (C0) to DQ2 (C2), DQ2 (C0) to DQ1 (C2), DQ3 (C0) to DQ7 (C2), DQ4 (C0) to DQ0 (C2), DQ5 (C0) and DQ6 (C2), DQ6 (C0) and DQ5 (C2), and DQ7 (C0) and DQ3 (C2) between the DQ pins of the normal package 110 and the DQ pins of the mirror package 120 in FIG. 21 indicate that the DQ pins are respectively connected to each other. Furthermore, solid lines connected to the dashed lines indicate that the DQ pins of both the packages 110 and 120 are respectively connected to the DQ pins DQ0 to DQ7 of the controller 200.

For example, DQ3 (C0), DQ5 (C0), DQ1 (C0), and DQ0 (C0) are disposed at pin coordinates 6-e, 5-e, 5-f, and 6-f of the normal package 110. DQ3 (C0), DQ5 (C0), DQ1 (C0), and DQ0 (C0) are respectively connected to pin coordinates 2-e, 3-e, 3-f, and 2-f of the mirror package 120 and respectively correspond to DQ7 (C2), DQ6 (C2), DQ2 (C2), and DQ4 (C2) of the mirror package 120.

Connection rules of the DQ pins of the normal package 110, the mirror package 120, and the controller 200 illustrated in FIG. 21 will be described with reference to FIG. 22 for easier understanding. FIG. 22 is a diagram illustrating only extracted numbers of the DQ pins of the controller 200 and the normal package 110 and extracted numbers of the DQ pins of the mirror package 120.

Figure 22:
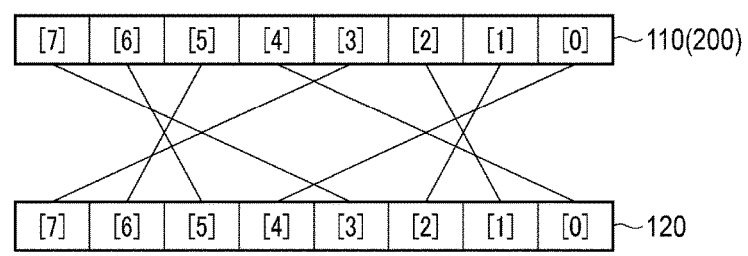
FIG. 22 is a diagram illustrating extracted numbers of the DQ pins of the controller, the normal package, and the mirror package illustrated in FIG. 21.

As illustrated in FIG. 22, DQ0 of the controller 200 and the normal package 110 are connected to DQ4 of the mirror package 120. In the same manner, DQ1 is connected to DQ2, DQ2 is connected to DQ1, DQ3 is connected to DQ7, DQ4 is connected to DQ0, DQ5 is connected to DQ6, DQ6 is connected to DQ5, and DQ7 is connected to DQ3.

When the symmetry command B is transmitted from the DQ pins of the controller 200 in a chip in the mirror package 120 having the connection rules of the patterns 1 to 5 described above, the symmetry command B is converted based on the connection rules, but is received at the DQ pins of the mirror package 120 as the same code. Thus, if the symmetry command B is used for a connection change command, it is possible to correspond to a semiconductor memory device including the mirror package 120 having the connection rules of patterns 1 to 5.

[2-2] Operation of Semiconductor Memory Device

Figure 23:
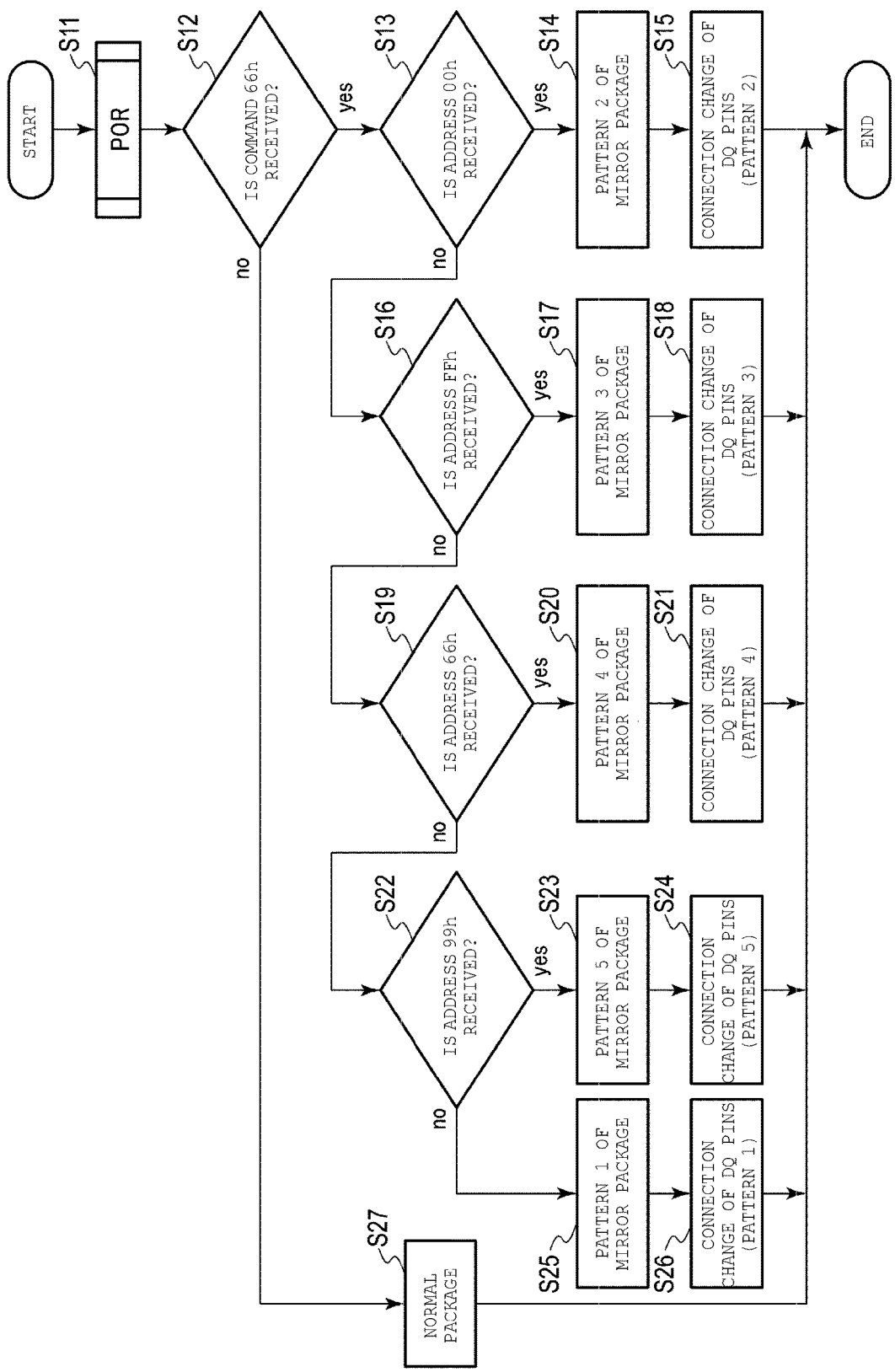
FIG. 23 is a flowchart illustrating an operation of a connection change of the DQ pins in the semiconductor memory device according to the second embodiment.
Figures 24, 25:
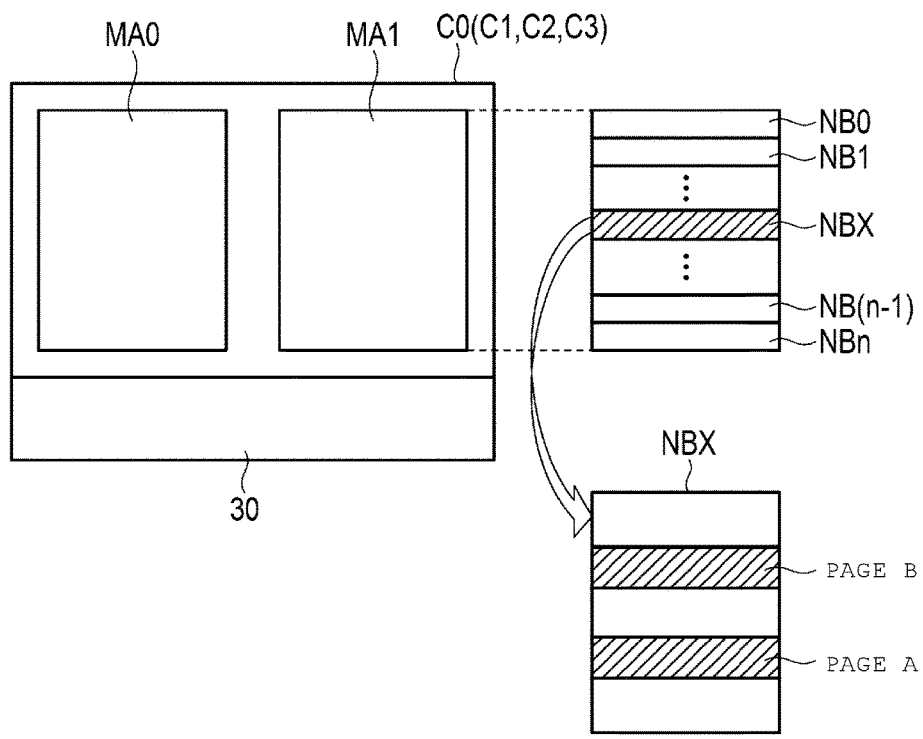
FIG. 24 is a diagram illustrating a correspondence relationship between addresses and different patterns in the flowchart of FIG. 23.
FIG. 25 is a diagram illustrating pages in which device ID codes of semiconductor memory device according to a third embodiment are stored.

FIG. 23 illustrates a flowchart of performing a connection change of the DQ pins according to a command and an address including the symmetry code B in the semiconductor memory device according to the second embodiment. FIG. 24 is a diagram illustrating a correspondence relationship between the addresses and the patterns 1 to 5 in the flowchart of FIG. 23.

First, if the chip C0 in the normal package 110 and the chip C2 in the mirror package 120 are powered on, or if the chips C0 and C2 receive a command FFh from the controller 200, the chips C0 and C2 perform power on read (POR) (Step S11).

Next, in a case where connections between the DQ pins of the chip C2 in the mirror package 120 are changed, the chip C2 first receives the chip enable signal CES_1 asserted from the controller 200 and is enabled. The chip C0 receives the chip enable signal CES_0 negated from the controller 200 and is disabled.

Subsequently, the controller 200 transmits a command 66h and an address (00h, FFh, 66h, or 99h) as a connection change command to the chips C0 and C2. At this time, since being enabled, the chip C2 receives the command and the address.

In a case where the chip C2 receives the command 66h and the address 00h (steps S12 and S13), the chip C2 is regarded as a chip having the connection rule of the pattern 2 in the mirror package 120 (step S14), and the connection change of the DQ pins are made in the chip C2 (Step S15). In the connection change of the DQ pins, the DQ pins are exchanged in the chip C2, based on the connection rule (pattern 2) between the DQ pins of the controller 200 and the DQ pins of the chip C2.

In addition, in a case where the command 66h and the address FFh are received (steps S12 and S16), the chip C2 is regarded as a chip having the connection rule of the pattern 3 in the mirror package 120 (step S17), and the connection change between DQ pins is made in the chip C2 (step S18). In the connection change of the DQ pins, the DQ pins are exchanged in the chip C2, based on the connection rule (pattern 3) between the DQ pins of the controller 200 and the DQ pins of the chip C2.

In addition, in a case where the command 66h and the address 66h are received (steps S12 and S19), the chip C2 is regarded as a chip having the connection rule of the pattern 4 in the mirror package 120 (step S20), and the connection change between DQ pins is made in the chip C2 (step S21). In the connection change of the DQ pins, the DQ pins are exchanged in the chip C2, based on the connection rule (pattern 4) between the DQ pins of the controller 200 and the DQ pins of the chip C2.

In addition, in a case where the command 66h and the address 99h are received (steps S12 and S22), the chip C2 is regarded as a chip having the connection rule of the pattern 5 in the mirror package 120 (step S23), and the connection change between DQ pins is made in the chip C2 (step S24). In the connection change of the DQ pins, the DQ pins are exchanged in the chip C2, based on the connection rule (pattern 5) between the DQ pins of the controller 200 and the DQ pins of the chip C2.

In addition, in a case where the chip C2 receives the command 66h and does not receive the address (00h, FFh, 66h, or 99h) (steps S12 and S22), the chip C2 is regarded as a chip having the connection rule of the pattern 1 in the mirror package 120 (Step S25) and the connection change of the DQ pins are made in the chip C2 (step S26). In the connection change of the DQ pins, the DQ pins are exchanged in the chip C2, based on the connection rule (pattern 1) between the DQ pins of the controller 200 and the DQ pins of the chip C2.

Meanwhile, since being disabled, the chip C0 does not receive the command 66h transmitted from the controller 200. In a case where the command 66h is not received (step S12), the chip C0 is regarded as a chip in the normal package 110 (step S27), and the operation ends. Thereby, the operation of the connection change of the DQ pins in the flash memory chips C0 and C2 of the semiconductor memory device ends.

[2-3] Effects of Second Embodiment

When a command and an address including the symmetry code B are input to the mirror package 120 having the connection rules of the patterns 1 to 5, even if the command and the address are converted based on the connection rule, the same code is received as it is. In the second embodiment, the command and the address including the symmetry code B are used for a connection change command, and the command and the address are associated with the connection rules of the patterns 1 to 5. Accordingly, it is possible to select a connection change of the DQ pins corresponding to the connection rule of the mirror package 120, according to the input command and address. The other effects are the same as in the first embodiment.

[3] Third Embodiment

A semiconductor memory device according to a third embodiment will be described. In a case where data written to flash memory chips in packages before being mounted on both surfaces of the substrate are read after the packages are mounted on the both surfaces of the substrate, the data may be converted into different data. Therefore, in the third embodiment, an example in which data written before the packages are mounted on the both surfaces of the substrate is read as correct data after being mounted will be described. For example, there is a device ID code as data to written in flash memory chips before packages are mounted on both surfaces of a substrate. Here, a case where the device ID code is read is used as an example. A structure and a circuit configuration of a semiconductor memory device according to the third embodiment are the same as in the first embodiment described above.

[3-1] Configuration of Semiconductor Memory Device

FIG. 25 is a diagram illustrating a page in which device ID codes of flash memory chips are stored. Each of the flash memory chips C0 to C3 includes memory cell arrays MA0 and MA1 including the memory cells 17, and a peripheral control circuit 30 for controlling the memory cell arrays MA0 and MA1. Each of the memory cell arrays MA0 and MA1 includes a plurality of blocks NB0, NB1, NB2, . . . , NBX, . . . , NB(n−1), NBn (n is a natural number of 0 or larger) which are erase units. Here, two memory cell arrays are illustrated, but three or more memory cell arrays may be used.

A device ID code A is stored in a page A having a specified address in the block NBX. Furthermore, a device ID code B obtained by converting the device ID code A is stored in the page B which is different in address from the page A in the block NBX, based on the above-described connection rules (patterns 1 to 5).

A command sequence of writing the device ID code A and the device ID code B to flash memory chips which are not mounted on both surfaces of a substrate will be described with reference to FIGS. 26A and 26B. Here, it is assumed that, after the packages are mounted on both surfaces of the substrate, the DQ pins of the chip in the mirror package 120 and the DQ pins of the controller 200 have the connection rule of pattern 1.

In a case where the device ID code A (for example, 01h, 23h, and 45h) are written to the page A in the block NBX of the flash memory chip, the sequence is performed as follows.

Figure 26A:
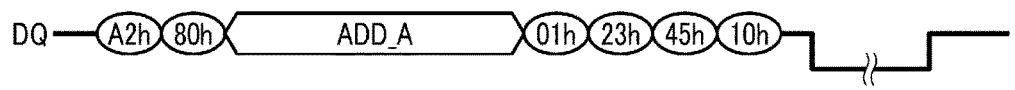
FIGS. 26A and 26B are diagrams illustrating a command sequence of writing the device ID codes in the packages before being mounted on both surfaces of a substrate.
Figure 27:
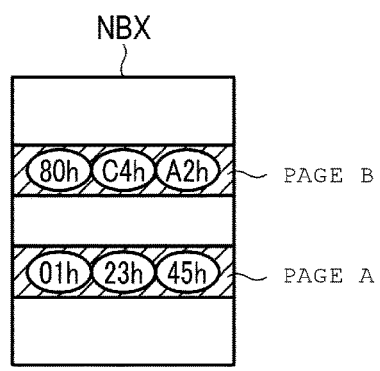
FIG. 27 is a diagram illustrating a block in which the device ID codes are written by the command sequence.

As illustrated in FIG. 26A, the chip first receives a command A2h indicating an SLC mode. Furthermore, the chip receives an address input command 80h. Following the command 80h, the chip receives an address ADD_A designating the page A and further receives the device ID code A (01h, 23h, and 45h). Subsequently, the chip receives a write execution command 10h. Thereby, the device ID code A stored in the page buffer is written to the page A in the block NBX, as illustrated in FIG. 27.

In addition, in a case where the device ID code B (80h, C4h, and A2h) are written to the page B in the block NBX of the flash memory chip, the sequence is performed as follows.

Figure 26B:
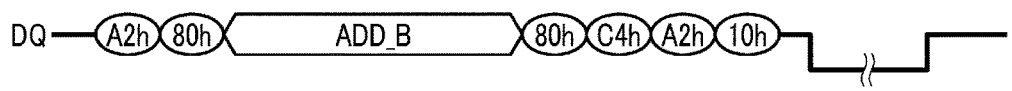

As illustrated in FIG. 26B, the chip first receives a command A2h. The chip further receives the address input command 80h. Following the command 80h, the chip receives the address ADD_B designating the page B, and further receives the device ID code B (80h, C4h, and A2h). Subsequently, the chip receives a write execution command 10h. Thereby, the device ID code B stored in the page buffer is written to the page B in the block NBX, as illustrated in FIG. 27.

[3-2] Operation of Semiconductor Memory Device

Figure 28:
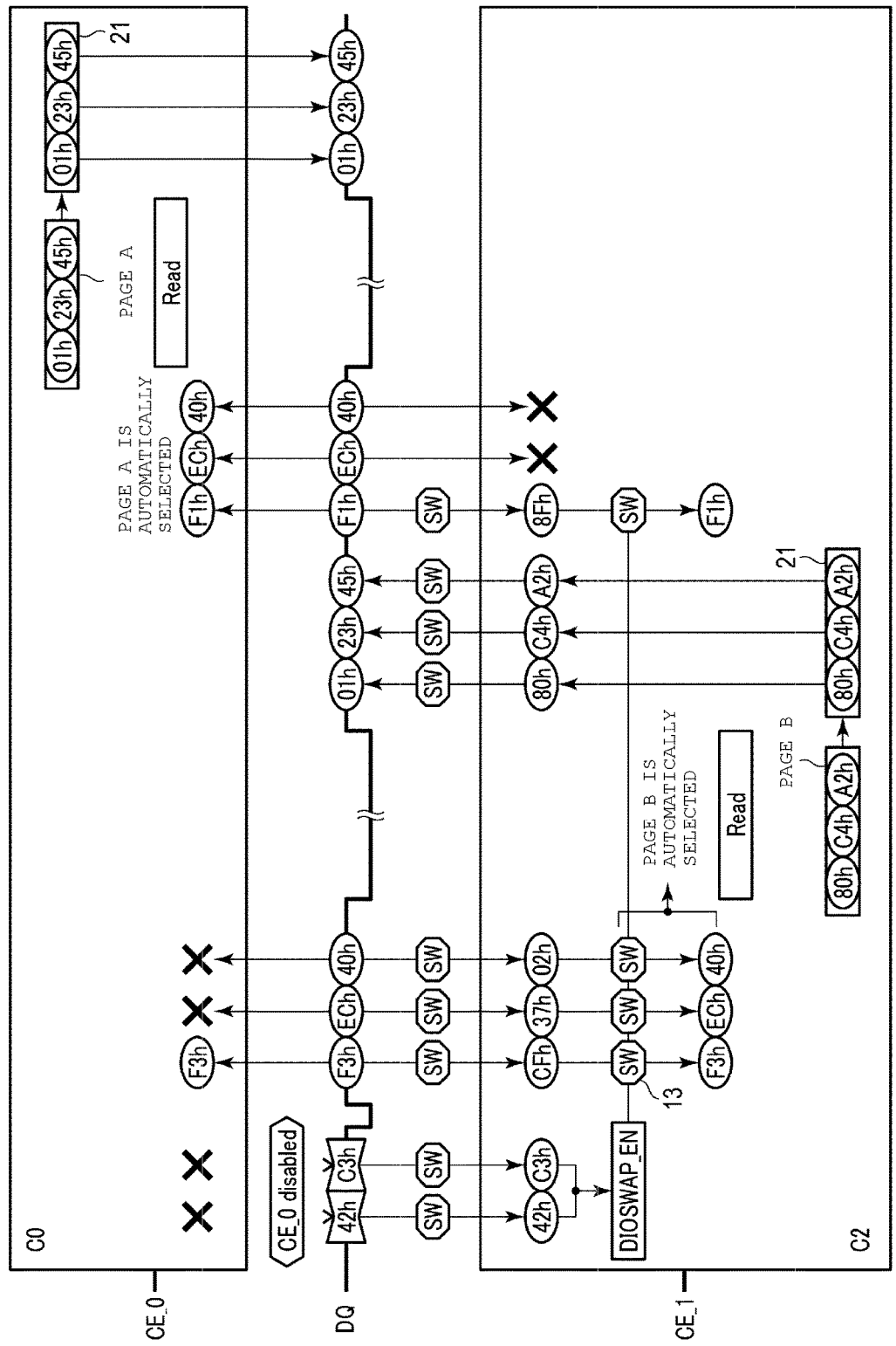
FIG. 28 is a diagram illustrating a command sequence of reading the device ID codes in the third embodiment.

Next, an example of a command sequence of reading the device ID codes A and B in the semiconductor memory device according to the third embodiment will be described. FIG. 28 is a diagram illustrating a read sequence of the device ID codes in the normal package and the mirror package having the connection rule of pattern 1. Here, an example in which "the command 42h and the address C3h" are used as a connection change command will be described.

First, the chip C2 receives the chip enable signal CES_1 asserted from the controller 200 and is enabled. The chip C0 receives the chip enable signal CES_0 negated from the controller 200 and is disabled.

Subsequently, in order to set the chip C2 in the mirror package 120 to a mirror mode, the controller 200 transmits "the command 42h and the address C3h" to the DQ pins of the chips C0 and C2. At this time, since being enabled, the chip C2 receives "the command 42h and the address C3h". Meanwhile, since being disabled, the chip C0 does not receive "the command 42h and the address C3h".

Since "the command 42h and the address C3h" correspond to the symmetry command A, the chip C2 in the mirror package 120 receives the same code as it is. If "the command 42h and the address C3h" are received, the selection signal DIOSWAP_EN is asserted in the chip C2 in the mirror package 120, and the mirror mode is set. In setting the mirror mode, the connection change of the DQ pins is made by the connection change circuit 13.

Next, the controller 200 transmits a command F3h to the DQ pins of the chips C0 and C2. The command F3h is a chip selection command, and selects the chip C2 here. The command F3h transmitted from the controller 200 is converted into a command CFh and is received at the DQ pins of the chip C2, based on the connection rule (pattern 1) between the DQ pins of the controller 200 and the DQ pins of the chip C2. However, the command CFh is further converted by the connection change circuit 13 in the chip C2 and returns to the command F3h. By the command F3h, the chip C2 in the mirror package 120 is selected, and the chip C0 in the normal package 110 is not selected.

Subsequently, the controller 200 transmits "a command ECh and an address 40h" to the DQ pins of the chips C0 and C2. At this time, since the chip C2 is selected and the chip C0 is not selected, "the command ECh and the address 40h" are received only by the chip C2 in the mirror package 120. Thereby, a device ID is read in the chip C2 in the mirror package 120.

Here, since the chip C2 is set to a mirror mode, the selection signal DIOSWAP_EN is asserted (enabled). In reading the device ID, in a case where the signal DIOSWAP_EN is asserted, the address of the page B of the block NBX is selected and the page B is read. The device ID code B (80h, C4h, and A2h) are stored in the page B. When being output from the DQ pins of the mirror package 120 to the DQ pins of the controller 200, the device ID code B read from the page B to the page buffer 21 is converted based on the connection rule of the pattern 1, and returns to the device ID code A (01h, 23h, and 45h).

Next, in the command sequence of reading the page A of the chip C0 in the normal package 110, the controller 200 first transmits a command F1h to the DQ pins of the chips C0 and C2. The command F1h is a chip selection command, and selects the chip C0 here. In the same manner, the command F1h transmitted from the controller 200 is converted into a command 8Fh based on the connection rule (pattern 1). However, the command 8Fh is further converted by the connection change circuit 13 and returns to the command F1h. The chip C0 in the normal package 110 is selected by the command F1h, and the chip C2 in the mirror package 120 is not selected.

Subsequently, the controller 200 transmits "a command ECh and an address 40h" to the DQ pins of the chips C0 and C2. At this time, since the chip C0 is selected and the chip C2 is not selected, "the command ECh and the address 40h" are received only by the chip C0 in the normal package 110. Thereby, the device ID is read in the chip C0 in the normal package 110.

Here, since the chip C0 is not set to a mirror mode, the selection signal DIOSWAP_EN is negated (disabled). In reading the device ID, in a case where the signal DIOSWAP_EN is negated, the address of the page A of the block NBX is selected and the page A is read. The device ID code A (01h, 23h, and 45h) are stored in the page A. Thereafter, the device ID code A read from the page A to the page buffer 21 is output from the DQ pins of the normal package 110 to the DQ pins of the controller 200 without being converted.

[3-3] Effect of Third Embodiment

In the third embodiment, data (for example, device ID code) written to the flash memory chips before packages including the flash memory chips are mounted on both surfaces of a substrate can be read as correct data after the packages are mounted on both surfaces of the substrate. Other effects are the same as the effects of the first embodiment described above.

[4] Other Modification Examples and the Like

The above-described embodiments can be applied to a double-side mounted semiconductor device including various types of semiconductor chips regardless of a nonvolatile memory (for example, a NAND flash memory), a volatile memory, a system LSI, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate that has a first main surface and a second main surface opposite to the first main surface;
a first package including a first semiconductor chip which is mounted on the first main surface and includes a first register, a plurality of first input/output (IO) terminals, and a first circuit connected between the first IO terminals and the first register; and
a second package including a second semiconductor chip which is mounted on the second main surface and includes a second register, a plurality of second input/output (IO) terminals, a second circuit connected between the second IO terminals and the second register, and a code identification circuit configured to generate a connection change command in the second semiconductor chip in response to a command of symmetrical bit values received through the second IO terminals, wherein
the second circuit is connected to the second IO terminals through a plurality of input lines and to the second register through a plurality of output lines, and is configured to change a connection path between the input lines and the output lines in response to the connection change command generated in the second semiconductor chip.

2. The semiconductor memory device according to claim 1, wherein
the second circuit changes the connection path between the input lines and the output lines in response to the connection change command according to a connection rule.

3. The semiconductor memory device according to claim 2, wherein the code identification circuit determines the connection rule based on an address that is received through the second IO terminals along with the command of symmetrical bit values, the bit values of the address also being symmetrical.

4. The semiconductor memory device according to claim 3, wherein the connection rule corresponds to one of a plurality of connection patterns, each of which specifies a different way the second IO terminals are connected to corresponding terminals of a controller relative to how the first IO terminals are connected to the corresponding terminals of the controller.

5. The semiconductor memory device according to claim 4, wherein one of the connections specifies a connection pattern for the second IO terminals that is a mirror image of a connection pattern for the first IO terminals.

6. The semiconductor memory device according to claim 1, wherein
the first circuit is connected to the first IO terminals through a plurality of input lines and to the first register through a plurality of output lines, and is configured to change a connection path between the input lines and the output lines in response to a connection change command generated in the first semiconductor chip, and
if no connection change command is generated in the first semiconductor chip, the first circuit does not change the connection path between the input lines and the output lines.

7. The semiconductor memory device according to claim 1, wherein the second semiconductor chip includes memory cells that are connected to the IO terminals such that the second circuit is not in a signal path between the IO terminals and the memory cells.

8. The semiconductor memory device according to claim 1, wherein the first and second semiconductor chips have the same configuration.

9. A memory system comprising:
a semiconductor memory device including a substrate that has a first main surface and a second main surface opposite to the first main surface, a first semiconductor chip which is mounted on the first main surface and includes a first register, a plurality of first input/output (IO) terminals, and a first circuit connected between the first IO terminals and the first register, and a second semiconductor chip which is mounted on the second main surface and includes a second register, a plurality of second input/output (IO) terminals, a second circuit connected between the second IO terminals and the second register, and a code identification circuit configured to issue a connection change command to the second circuit in response to a command of symmetrical bit values, and
a controller including a plurality of third input/output (IO) terminals that are respectively connected to a corresponding one of the first IO terminals and a corresponding one of the second IO terminals, wherein
the controller, prior to issuing a read command or a write command to the second semiconductor chip, issues the command of symmetrical bit values to the second semiconductor chip that causes the second circuit to change a connection path between the second IO terminals and the second register.

10. The memory system according to claim 9, wherein
the second circuit changes the connection path according to a connection rule.

11. The memory system according to claim 10, wherein the controller issues an address to the second semiconductor chip along with the command of symmetrical bit values, and the code identification circuit determines the connection rule based on the address.

12. The memory system according to claim 11, wherein the connection rule corresponds to one of a plurality of connection patterns, each of which specifies a different way the second IO terminals are connected to the corresponding terminals of the controller relative to how the first IO terminals are connected to the corresponding terminals of the controller.

13. The semiconductor memory device according to claim 12, wherein one of the connections specifies a connection pattern for the second IO terminals that is a mirror image of a connection pattern for the first IO terminals.

14. The memory system according to claim 9, wherein the second semiconductor chip includes memory cells that are connected to the IO terminals such that the second circuit is not in a signal path between the IO terminals and the memory cells.

* * * * *